(12) United States Patent
Balachandran et al.

(10) Patent No.: US 8,726,137 B2
(45) Date of Patent: May 13, 2014

(54) ENCODING AND DECODING METHODS FOR EXPURGATED CONVOLUTIONAL CODES AND CONVOLUTIONAL TURBO CODES

(75) Inventors: Kumar Balachandran, Cary, NC (US); Tsao-Tsen Chen, Älvsjö (SE); Havish Koorapaty, Saratoga, CA (US); Rajaram Ramesh, Raleigh, NC (US); Tripura Ramesh, legal representative, Raleigh, NC (US)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 627 days.

(21) Appl. No.: 12/696,141

(22) Filed: Jan. 29, 2010

(65) Prior Publication Data

US 2010/0287453 A1 Nov. 11, 2010

Related U.S. Application Data

(60) Provisional application No. 61/149,113, filed on Feb. 2, 2009, provisional application No. 61/151,610, filed on Feb. 11, 2009.

(51) Int. Cl.
*H03M 13/03* (2006.01)

(52) U.S. Cl.
USPC .......................................................... 714/786

(58) Field of Classification Search
USPC .......................................................... 714/786
See application file for complete search history.

(56) References Cited

U.S. PATENT DOCUMENTS

| | | | |
|---|---|---|---|
| 4,747,104 A * | 5/1988 | Piret | 714/761 |
| 6,347,122 B1 | 2/2002 | Chen et al. | |
| 7,197,685 B2 * | 3/2007 | Limberg | 714/756 |
| 7,606,336 B2 | 10/2009 | Lee et al. | |
| 7,853,859 B2 | 12/2010 | Ojard | |
| 7,983,363 B2 | 7/2011 | Jayaraman et al. | |
| 8,132,072 B2 * | 3/2012 | El-Khamy et al. | 714/755 |
| 2003/0033565 A1 | 2/2003 | Crozier et al. | |
| 2007/0033509 A1 | 2/2007 | Gupta | |
| 2007/0089043 A1 | 4/2007 | Chae et al. | |
| 2007/0174757 A1 | 7/2007 | Gho et al. | |
| 2007/0245209 A1 | 10/2007 | Shi et al. | |
| 2009/0070658 A1 | 3/2009 | Patapoutian et al. | |

(Continued)

FOREIGN PATENT DOCUMENTS

WO 2009/058087 A1 5/2009

OTHER PUBLICATIONS

Danashgaran, Linear subcodes of turbo codes with improved distance spectra, 2004, IEEE, vol. 50, pp. 3291-3294.*

(Continued)

*Primary Examiner* — Albert Decady
*Assistant Examiner* — Enam Ahmed

(57) ABSTRACT

A convolutional encoder (50) comprises an expurgation unit (22) and a first component convolutional encoder section (24). A convolutional turbo encoder (20) comprises an expurgation unit (22); a first component convolutional encoder section (24); a second component convolutional encoder section (26); and an interleaver (28). For both the convolutional encoder (50) and the expurgating convolutional turbo encoder (20) the expurgation unit (22) inserts predetermined values at selected bit positions of an input bit sequence and thereby provide an expurgated input bit sequence. A lower rate convolutional code is obtained from a higher rate code via expurgation.

16 Claims, 11 Drawing Sheets

(56) References Cited

U.S. PATENT DOCUMENTS

| | | | |
|---|---|---|---|
| 2009/0103659 | A1 | 4/2009 | Chen et al. |
| 2009/0150755 | A1 | 6/2009 | Chen et al. |
| 2010/0169747 | A1 | 7/2010 | Chen et al. |
| 2011/0060972 | A1 | 3/2011 | Shi et al. |

OTHER PUBLICATIONS

IEEE 802.16 Working Group on Broadband Wireless Access Standards.
Mzyece et al, "Performance evaluation of suboptimal decoding schemes for tail biting convolutional codes in EDGE headers," IEE Electronics Letters, vol. 39, No. 17, pp. 1280-1281, Aug. 2003.
Shao et al, "Two decoding algorithms for tail-biting codes,"IEEE Trans. Commun., vol. 51, No. 10, pp. 1658-1665, Oct. 2003.
Bahl et al, "Optimal decoding of linear codes for minimizing symbol error rate," IEEE Trans. Inform. Theory, vol. 20, pp. 284-287, Mar. 1974.
Anderson et al, "Tailbiting MAP decoders," IEEE J. Select. Areas Commun., vol. 16, pp. 297-302, Feb. 1998.
Frenger et al, "Convolutional Codes with Optimum Distance Spectrum," IEEE Communications Letters, IEEE Service Center, Piscataway, NJ, vol. 3, No. 11, Nov. 1, 1999; pp. 317-319.
Lassign et al, "Packet Error Rates of Terminated and Tailbiting Convolutional Codes", PROC DSPCS '02, 2002, pp. 78-83.
Chen et al, "Improved Tail-Biting convolutional Codes for 802.16e Frame Control Header", Wireless Conference, 2008, EW 2008, 14$^{th}$ European IEEE, Piscataway, NJ, Jun. 22, 2008, pp. 1-7.
Ma et al, "On tail biting convolutional codes," IEEE Trans. Commun., vol. 34, pp. 104-111, Feb. 1986.
Tsao-Tsen (Jason) Chen, "Tail-Biting Convolutional Codes with Expurgation and Rate-Compatible Puncturing for the Secondary Fast Feedback Channel". IEEE 2009, pp. 1-20 (EA Mar. 5, 2014).
Mzyece et al, "Performance evaluation of suboptimal decoding schemes for tail biting convolutional codes in EDGE headers," IEEE Electronics Letters, vol. 39, No. 17, pp. 1280-1281, Aug. 2003.
Cox et al, "An efficient adaptive circular viterbi algorithm for decoding generalized tailbiting convolutional codes," IEEE Trans. Veh. Technol., vol. 43, pp. 57-68, Feb. 1994.
Berrou et al, "Multiple parallel concatenation of circular recursive convolutional (CRSC) codes," Annals of Telecommunications, vol. 54, No. 3-4, pp. 166-172, Mar.-Apr. 1999.
Wang et al, "On MAP decoding for tail-biting convolutional codes," IEEE International Symposium on Information Theory (ISIT) 1997, pp. 225, Jun. 1997.
Ståhl et al, "Optimal and near-optimal encoders for short and moderate-length tail-biting trellises," IEEE Trans. Inform. Theory, vol. 45, pp. 2562-2571, Nov. 1999.
Shao et al, "Two decoding algorithms for tail-biting codes," IEEE Trans. Commun, vol. 51, No. 10, pp. 1658-1665, Oct. 2003.
Bahl et al, "Optimal decoding of liner codes for minimizing symbol error rate," IEEE Trans. Inform. Theory, vol. 20, pp. 284-287, Mar. 1974.

Anderson et al, "Tailbiting MAP decoders," IEEE J. Select Areas Commun., vol. 16, pp. 297-302, Feb 1998.
Chen et al, "Final report on 2005 WiMAX link simulation," 05/0363-6/FCP 101 3630 Uen, Ericsson Internal Technical Document, Mar. 2006.
Frenger et al, "Convolution Codes with Optimum Distance Spectrum", IEEE Communications Letters, IEEE Service Center Piscataway, NJ, vol. 3, No. 11, Nov. 1, 1999; pp. 317-319.
Lassign et al, "Packet Error Rates for Terminated and Tailbiting Convolutional Codes", PROC DSPCS '02, 2002, pp. 78-83.
Chen et al, "Improved Tail-biting Convolution Codes for 802.16e Frame Control Header", Wireless Conference, 2008, EW 2008, 14$^{th}$ European IEEE, Piscataway, NJ, Jun. 22, 2008, pp. 1-7.
International Preliminary Report on Patentability mailed Jun. 9, 2011 in PCT Application No. PCT/SE2009/051326.
International Preliminary Report on Patentability mailed Aug. 2, 2011 in corresponding PCT Application No. PCT/SE2010/050112.
International Search Report mailed Dec. 23, 2010 in PCT Application PCT/SE2009/051326.
International Search Report mailed Feb. 27, 2009 in PCT application PCT/SE2008/051236.
U.S. Office Action mailed Sep. 15, 2011 in U.S. Appl. No. 12/140,956.
U.S. Office Action mailed Oct. 13, 2011 in U.S. Appl. No. 12/260,340.
Larsen, "Short convolutional codes with maximal free distance rate ½, ⅓, and ¼," IEE Trans. Inform. Theory, vol. 19, pp. 371-372, May 1973.
3GPP TS 45.003, "3$^{rd}$ Generation Partnership Project; Technical Specification Group GSM/EDGE Radio Access Network; Channel Coding (Release 7)", V7.1.0, Feb. 2007.
Chang et al, "Some extended results on the search for good convolutional codes," IEEE Trans. Inform. Theory, vol. 43, pp. 1682-1697, Sep. 1997.
Öberg et al, "Application of Distance Spectrum Analysis to Turbo Code Performance Improvement", in Proc. of 35$^{th}$ Annual Allerton Conference on Communication, Control and Computing, 1997.
Ståhl et al, "A note on tailbiting codes and their feedback encoders," IEEE Trans. Inform, Theory, vol. 48, pp. 529-534, Feb. 2002.
3GPP TS 36.212, "3$^{rd}$ Generation Partnership Project; Technical Specification Group Radio Access Network; Evolved Universal Terrestrial Radio Access (E-UTRA); Multiplexing and channel Coding (Release 8)", V8.0.0, Sep. 2007.
Ould-Cheikh-Mouhamedou et al, "Distance measurement for double binary turbo codes and a new interleaver design for DVB-RCS," IEEE Globecom 04, pp. 172-178.
IEEE Std 802.16-2004, "IEEE Standard for Local and Metropolitan Area Networks—Part 16: Air Interface for Fixed Broadband Wireless Access Systems", Oct. 2004.
IEEE Std P802.16e-2005, "IEEE Standard for Local and Metropolitan Area Networks—Part 16: Air Interface for Fixed and Mobile Broadband Wireless Access Systems", Feb. 2006.

* cited by examiner $S_0 = 00$  $S_1 = 01$  $S_2 = 10$  $S_3 = 11$

ENCODING AND DECODING METHODS FOR EXPURGATED CONVOLUTIONAL CODES AND CONVOLUTIONAL TURBO CODES

This application claims the priority and benefit of U.S. provisional patent application 61/149,113, filed Feb. 2, 2009 and U.S. provisional patent application 61/151,610, filed Feb. 11, 2009 both of which are incorporated herein by reference in their entirety. This application is related to U.S. patent application Ser. No. 12/621,604 filed Nov. 19, 2009, entitled "Optimum Distance Spectrum Feedforward LOW RATE Tail-Biting Convolutional Codes", which is a continuation-in-part of U.S. patent application Ser. No. 12/260,340, filed Oct. 29, 2008, entitled "Optimum Distance Spectrum Feedforward Tail-Biting Convolutional Codes", both of which are incorporated by reference herein in their entirety. This application is also related to U.S. patent application Ser. No. 12/140,956, entitled REDUCED-COMPLEXITY DECODING ALGORITHMS FOR TAIL-BITING CONVOLUTIONAL CODES, which is incorporated by reference herein in its entirety.

TECHNICAL FIELD

This invention pertains to convolutional coding and convolutional turbo coding, with particular but non-exclusive application to telecommunications.

BACKGROUND

In many environments data in various forms (e.g., various protocols, modulations, etc.) can be transmitted over a channel from a transmitter to a receiver. Depending on the type and circumstances of operation, some channels are more or less prone or susceptible to loss or degradation of the data being transmitted over the channel, with differing channels having differing degrees of potential loss or corruption. For example, a wireline channel typically has a relatively higher degree of integrity and reliability than a channel existing over a radio or interface.

Detection of loss or inaccurate transmission of data over a channel is possible when certain additional information in the form of an error detection code is added to the data stream. For example, at a transmitter a frame or block of data can have appended to it an error detection code in the form of (for example) a check character(s) or check sum which is computed or otherwise derived from the block. Upon reception of the block by the receiver, the receiver can independently recompute or re-derive the error detection code (e.g., the receiver's version of the check character(s) or check sum). If the recomputed or re-derived error detection code (e.g., check sum) is the same as the error detection code included in the received block or frame, the receiver can confirm that the block or frame is correctly decoded.

In addition to error detection techniques, error correcting techniques are also known. For example, error correction codes (generated by polynomials that operate over a frame or block of user data) can also be added to the data stream. Upon reception of the complete frame or block, using the known error correction code/technique the receiver can locate and correct certain errors in the data stream.

Thus, error control coding is used in many communication applications to introduce redundancy into the transmitted information sequence so that the decoder at the receiver may recover from errors induced during transmission. Error control codes may broadly be classified as block codes and convolutional codes. The encoding operation for a (n, k) linear block code may be characterized as $v=G^T u$, where u is a k×1 vector of representing the information sequence, G is a k×n generator matrix that defines the code and v is a n×1 vector representing the encoded sequence.

Convolutional codes may also be represented as described above, although their encoding operation may be implemented in a simple manner. Convolutional codes are commonly specified by three parameters; (n, m, q). Of these three parameters, n represents the number of output bits; m represents the number of input bits; and q represents the number of memory registers employed to implement the convolutional code. The quantity m/n, called the code rate, is a measure of the efficiency of the code. Often the manufacturers of convolutional code chips specify the code by parameters (n,m,k), where k is the constraint length $k=m(q-1)$.

Convolutional codes convolve the input sequence with one or more generators with the encoding operation being implemented quite simply using shift registers. FIG. 1 shows an example encoder and encoding operation for a convolutional code having a code rate of 1/2. The information sequence u is input into the memory registers (e.g., shift registers) M1 and M2 and is input one bit at each clock time. The convolutional coder also include n number of modulo-2 adders which represent the n number of encoded bits which are output each clock time. FIG. 1 thus shows two adders A1 and A2 since n is two for the case shown in FIG. 1. The memory registers M1 and M2 are connected to the adders A1 and A2 in accordance with the particular generator polynomials chosen for the convolutional encoder. That is, which of the memory registers is connected to each adder depends on the generator polynomials chosen for the coder. One code can have completely different properties from another one depending on the particular generator polynomials chosen.

An encoder structure of a rate 1/n feedforward convolutional code (CC) with overall constraint length v is shown in FIG. 2, where the content consisting of zeros and ones of the v number of shift-register elements is called the state of the encoder. The n number of generator polynomials specify the connections from the shift-registers to the n outputs. The n number of generator polynomials are represented by the set $G=(g_0, \ldots, g_{n-1})$, where $g_0=(g_0^{(0)}, g_0^{(1)}, \ldots, g_0^{(v)}), \ldots, g_{n-1}=(g_{n-1}^{(0)}, g_{n-1}^{(1)}s, \ldots, g_{n-1}^{(v)})$. The coefficients $g_k^{(j)}$, for $k=0, \ldots, n-1$ and $j=0, \ldots, v$, is either 0 (no connection) or 1 (with connection). $U_i$ is the input bit at time i, and $(v_i^{(0)}, \ldots, v_i^{(n-1)})$ are the n output bits at time i. Thus, a convolutional code can be specified by its set of generator polynomials $G=(g_0, \ldots, g_{n-1})$.

Another example encoder, which happens to implement a Tail-biting convolutional codes (TBCC) [hereinafter discussed], is shown in FIG. 2. The encoder of FIG. 2 has code rate 1/n=1/2, constraint length v=6, and $G=(g_0,g_1)$, where $g_0=(1, 1, 1, 1, 0, 0, 1)$ and $g_1=(1, 0, 1, 1, 0, 1, 1)$. In other words, the adder $A_{g0}$ for the first polynomial $g_0$ is connected to receive the bit values from the first through fourth positions and the seventh position of the shift register chain of FIG. 2 (e.g., the first position being the input to shift register $U_{i-1}$; the second position being the output of shift register $U_{i-2}$; the third position being the output of shift register $U_{i-3}$; and so on to the seventh position being the output of shift register $U_{i-6}$). The adder $A_{g1}$ for the second polynomial $g_1$ is connected to receive the bit values from the first, third, fourth, sixth, and seventh positions of the shift register chain of FIG. 2.

To represent the generator polynomials in a more compact way, an octal notation is usually used, where zeros (0) are appended on the right of the binary notation to make the total number of digits a multiple of 3. For example, with reference to the encoder of FIG. 2, two zeroes are appended to the right of $g_0$ to generate the binary vector $g_0'=(1, 1, 1, 1, 0, 0, 1, 0, 0)$. Then the digits in $g_0'$ are grouped with three digits per group and the result is $g_0''=(111, 100, 100)$. Finally each group in $g_0''$ is transformed to its equivalent octal notation and the result is (7, 4, 4). The generator polynomials depicted for the encoder of FIG. 2 in octal notation are thus given by G=(744, 554). The more compact octal notation is typically used herein to represent the generator polynomials.

In the recursive convolutional encoder of FIG. 3 the sequence of input bits $d_n$ is fed to shift registers $R_{n-1}$ through $R_{n-k}$. The contents of the shift registers R are applied to gates whose outputs are determined by coefficients $a_1$ through $a_k$ of the feedback generator polynomial of the encoder. The contents of the shift registers R are also applied to other gates whose outputs are determined by coefficients $b_1$ through $b_k$ of the feedforward generator polynomial of the encoder. Typically in operation the input sequence $d_0$ is output first, followed by the encoded output represented in FIG. 3 by sequence $p_n$. In FIG. 3 two bits (systematic bit $d_0$ and parity bit $p_n$) are output for each input bit $d_n$.

A convolutional turbo-encoder uses two component convolutional encoders with the input between the two encoders. FIG. 4 shows such a convolutional turbo-encoder with its two component convolutional encoders $C_1$ and $C_2$. That is, in the case of a turbo-encoder, the component encoders are typically recursive systematic encoders in contrast with the non-systematic encoder shown in FIG. 1. A recursive systematic encoder has feedback from the gates as shown in the FIG. 3, which gives it the recursive property. The term systematic refers to the fact that part of the encoder output is the information sequence itself.

Convolutional codes and turbo codes are particularly useful in scenarios where a series of different code rates must be used. In such situations, typically, a low rate "mother code" is used as the basic code from which codes for all the other higher code rates are derived. For the special case of the number of input bits (m) being 1, the codes of rates like 1/2, 1/3, 1/4, or 1/5, are sometimes called mother codes. The technique of not transmitting a selected one or more of the output bits is called puncturing, and can be used to provide a different code rate. Thus, these higher code rates are derived by puncturing the output of the encoder, i.e., by only selecting some of the output bits. The number of fraction of output bits discarded determines the new coding rate.

The output of a convolutional encoder depends on the contents of the shift registers when the first input bit is encoded. The contents are typically set to zero. The actual rate is slightly lower than the basic code rate due to the extra encoded bits that are generated when the last few bits in the information sequences are flushed out of the shift registers. These bits are called the tail of the information sequence. Thus, for the rate-1/2 code shown in FIG. 2, if a sequence of 12 information bits is encoded, the number of output bits generated is (12+6)*2=36. Thus, the actual rate in this case is 1/3, although the encoding was done using a rate 1/2 code. As the length of the information bit sequence increases, the effect of the tail on the rate diminishes. However, for short sequences the effect can be significant as evidenced by the example above.

In such situations, a tail-biting encoder is useful. Tail-biting convolutional codes (TBCC) are simple and powerful forward error correction (FEC) codes, as described, e.g., in H. H. Ma and J. K. Wolf, "On tail biting convolutional codes," IEEE Trans. Commun., vol. 34, pp. 104-111, February 1986. Tail-biting codes are described, e.g., in U.S. patent application Ser. No. 12/140,956, entitled "REDUCED-COMPLEXITY DECODING ALGORITHMS FOR TAIL-BITING CONVOLUTIONAL CODES", and U.S. patent application Ser. No. 12/260,340, entitled "Optimum Distance Spectrum Feedforward Tail-Biting Convolutional Codes", both of which is incorporated by reference herein in its entirety.

In a tail-biting encoder, the initial contents of the shift register are exactly the same as the last bits in the information sequence. Thus, when encoding the sequence 101111110011 with the encoder shown in the FIG. 2, the contents of the shift register will initially be set to 110011 (from right to left in the shift registers). The encoding operation now stops without flushing out the last few bits in the information sequence from the registers since they were already in the register at the beginning. Thus, in the example above, the number of output bits produced for 12 information bits is 24 instead of 36. A tail-biting code is also a cyclic code since the codewords for circular shifts of the information sequence are the corresponding circular shifts of the encoded sequence.

Puncturing of the encoder output is widely used with both convolutional encoders and convolutional turbo encoders. In contrast to puncturing, for some block codes, a lower rate code is derived from a higher rate code by not considering some of the rows in the generator matrix. The effective code is characterized by a generator matrix that is derived from the higher code rate generator matrix by deleting these rows. Codes that are derived in this manner are called expurgated codes. Expurgated codes have been used for block codes, but to the best of the inventors' knowledge, they have not been used for convolutional codes.

Convolutional codes are widely used in many communication systems. As is known, the IEEE 802.16 Working Group on Broadband Wireless Access Standards develops formal specifications for the global deployment of broadband Wireless Metropolitan Area Networks. Although the 802.16 family of standards is officially called WirelessMAN, it has been dubbed WiMAX (from "Worldwide Interoperability for Microwave Access") by an industry group called the WiMAX Forum. FIG. 2 shows an example encoder for the 802.16 Tail-biting convolutional codes (TBCC).

Turbo codes derived from multiple component recursive systematic convolutional codes are used in the latest generation of wireless communication standards and in numerous other applications as well. In some such applications it may be necessary to have a range of code rates where the lowest code rate is a fraction for which it is difficult to search for good codes. A range of code rates from 7/60 to 12/60 is currently being considered for the fast feedback channel (TBCC) in IEEE 802.16m.

What are needed therefore, and provided by the technology disclosed herein, are method, apparatus, and techniques for obtaining and/or using lower rate convolutional codes and convolutional turbo codes suitable from higher rate codes.

SUMMARY

In various aspects the technology described herein pertains to convolutional coding, e.g., encoding and decoding of convolutional codes, both in terms of turbo and non-turbo convolutional coding. In differing embodiments the convolutional and convolutional turbo coding apparatus and methods described herein can be implemented by circuitry (e.g., an application specific integrated circuit [ASIC]) or in other ways such as by computer(s), and can be used in many different data communications, data storage, and data processing fields. An illustrative example data communications field involves encoding of data transmitted in a network over a radio or wireless interface.

In some of its aspects the technology disclosed herein concerns encoders, both convolutional encoders and convolutional turbo encoders. An example embodiment of a convolutional turbo encoder comprises an expurgation unit; a first component convolutional encoder section; a second component convolutional encoder section; and an interleaver. The expurgation unit is configured to insert predetermined values at selected bit positions of an input bit sequence and thereby provide an expurgated input bit sequence. The first component convolutional encoder section is connected to receive the expurgated input bit sequence and configured to use the expurgated input bit sequence to perform a first convolutional encoding operation and thereby provide a systematic bit sequence (same as the expurgated input bit sequence) and a first parity bit sequence. The interleaver is connected between the expurgation unit and the second component convolutional encoder section and configured to receive the expurgated input bit sequence and to provide an interleaved expurgated input bit sequence. The second component convolutional encoder section is connected to receive an interleaved expurgated input bit sequence and configured to perform a second convolutional encoding operation using the interleaved expurgated input bit sequence and thereby yield a second parity bit sequence. A lower rate convolutional turbo code (comprising the systematic bit sequence, the first parity bit sequence, and the second parity bit sequence) is thereby obtained from a higher rate code (the mother code) via expurgation.

In an example embodiment, the first component convolutional encoder section, the second component convolutional encoder section, the interleaver, and the expurgation unit of the convolutional turbo encoder can comprise a circuit, e.g., a semiconductor or hardware circuit such as an application specific integrated circuit. The convolutional turbo encoder can also take other implementation forms and be realized by other technologies, such as computer-implemented embodiments. In a computer-implementation embodiment, for example, the convolutional turbo encoder can comprise one or more computers and memory wherein the first component convolutional encoder section, the second component convolutional encoder section, and the expurgation unit are implemented by the computer and the selected bit positions for insertion are chosen according to an expurgation pattern which is stored in the memory.

In an example embodiment and additional aspect, the first component convolutional encoder section and the second component convolutional encoder section are structured according to generator polynomials that implement a tail-biting convolutional code.

In an example embodiment and additional aspect, the selected bit positions can be chosen according to an expurgation pattern which provides a predetermined Hamming distance and predetermined codeword multiplicity.

In an example embodiment and additional aspect, the selected bit positions can be chosen according to an expurgation pattern specified by predetermined tables. For example, for a code rate listed in any of Table 1, Table 2, or Table 3, the selected bit positions can be chosen according to an expurgation pattern shown associated with the code rate in Table 1, Table 2, or Table 3.

The structure and operation of a convolutional (non-turbo) encoder is more simplified than that of a convolutional turbo encoder and can be understood with reference to the convolutional turbo encoder structure and operation. An example embodiment of a convolutional (non-turbo) encoder comprises an expurgation unit and a first component convolutional encoder section. As with the convolutional turbo encoder, the expurgation unit is configured to insert predetermined values at selected bit positions of an input bit sequence and thereby provide an expurgated input bit sequence. However, the expurgated input bit sequence output by the expurgation unit of the convolutional encoder is applied only to the first component convolutional encoder section. The first component convolutional encoder section is connected to receive the expurgated input bit sequence and configured to use the expurgated input bit sequence to perform a first convolutional encoding operation and thereby provide a systematic bit sequence and a first parity bit sequence. A lower rate convolutional code (comprising the systematic bit sequence and the first parity bit sequence) is thereby obtained from a higher rate code (the mother code) via expurgation.

As with the convolutional turbo encoder, constituent units of the convolutional encoder can comprise a circuit, e.g., a semiconductor or hardware circuit such as an application specific integrated circuit. The convolutional encoder can also take other implementation forms and be realized by other technologies, such as computer-implemented embodiments. In a computer-implementation embodiment, for example, the convolutional encoder can comprise one or more computers and memory wherein the first component convolutional encoder section, and the expurgation unit are implemented by the computer and the selected bit positions for insertion are chosen according to an expurgation pattern which is stored in the memory. Moreover, in an example embodiment and additional aspect, the first component convolutional encoder section of the convolutional encoder can be structured according to generator polynomials that implement a tail-biting convolutional code. Furthermore, in an example embodiment and additional aspect, the selected bit positions can be chosen according to an expurgation pattern which provides a predetermined Hamming distance and predetermined codeword multiplicity. As with the convolutional turbo encoder, in an example embodiment of the convolutional encoder and additional aspect, the selected bit positions can be chosen according to an expurgation pattern specified by the aforementioned predetermined tables.

Another aspect of the technology disclosed herein concerns an encoding method. In an example embodiment and mode which concerns convolutional turbo encoding the encoding method comprises acts of expurgation; first component convolutional encoding operation; interleaving; and second component convolutional encoding operation. The expurgation act comprises expurgating an input sequence by inserting predetermined values at selected bit positions of an input bit sequence and thereby providing an expurgated input bit sequence. The first component convolutional encoding operation comprises convoluting the expurgated input bit sequence and thereby provides a systematic bit sequence and a first parity bit sequence. The interleaving act comprises interleaving bits of the expurgated input bit sequence and thereby providing interleaved expurgated input bit sequence. The second component convolutional encoding operation comprises convoluting the interleaved expurgated input bit sequence and thereby providing a second parity bit sequence.

In an example embodiment and mode and additional aspect, the convolutional turbo encoding method further comprises using generator polynomials that implement a tail-biting convolutional code in the first convolutional encoding operation and the second convolutional encoding operation.

In an example embodiment and mode and additional aspect, the convolutional turbo encoding method further comprises using a circuit to implement the expurgation, the first convolutional encoding operation, the interleaving, and the second convolutional encoding operation.

In an example embodiment and mode and additional aspect, the convolutional turbo encoding method further comprises using a computer to implement the expurgation, the first convolutional encoding operation, the interleaving, and the second convolutional encoding operation, and using a memory to store an expurgation pattern employed to choose the selected bits.

In an example embodiment and mode and additional aspect, the convolutional turbo encoding method further comprises choosing the selected bit positions according to an expurgation pattern which provides a predetermined Hamming distance and predetermined codeword multiplicity.

In an example embodiment and mode and additional aspect, the convolutional turbo encoding method further comprises the selected bit positions according to an expurgation pattern shown associated with a code rate in Table 1, Table 2, or Table 3.

An example embodiment and mode which concerns the convolutional (non-turbo) encoding method is more simplified than that of a convolutional turbo encoding and can be understood with reference to convolutional turbo encoding. The convolutional (non-turbo) encoding method comprises acts of expurgation and first component convolutional encoding operation, but not interleaving and not second component convolutional encoding operation.

As with the convolutional turbo encoding method, the (non-turbo) convolutional encoding method can comprise using a circuit, e.g., a semiconductor or hardware circuit such as an application specific integrated circuit to implement the method. Other implementations can be realized by other technologies, such as computer-implemented embodiments. Moreover, in an example embodiment and additional aspect, the convolutional encoding method can comprise using generator polynomials that implement a tail-biting convolutional code in the first convolutional encoding operation. Furthermore, in an example embodiment and additional aspect, the convolutional encoding method can comprise choosing the selected bit positions according to an expurgation pattern which provides a predetermined Hamming distance and predetermined codeword multiplicity. As with the convolutional turbo encoding, in an example embodiment of the convolutional encoding and additional aspect, the selected bit positions can be chosen according to an expurgation pattern specified by the aforementioned predetermined tables.

In some of its aspects the technology disclosed herein concerns a decoder, e.g., a decoder suitable for decoding a bit sequence which has been encoded using one or both of convolutional codes or convolutional turbo codes. Such a decoder is connected to receive an encoded bit sequence and configured to use an expurgation pattern utilized to generate the encoded bit sequence to determine a decoded bit sequence from the encoded bit sequence.

In an example embodiment the decoder is configured to receive the encoded bit sequence and to determine therefrom the decoded bit sequence by determining state transition branches included in a trellis path to a surviving node of the trellis. The decoder is preconfigured to use the expurgation pattern to discard selected state transition branch(es) that correspond to input bit(s) having a predetermined value when determining the surviving node of the trellis. In an example implementation, the decoder discards the selected state transition branch(es) by assigning a discard-causing metric(s) to the selected state transition branch(es). In another implementation, the decoder is configured to discard the selected state transition branch(es) by assigning a discard-causing apriori probability value(s) to the selected state transition branch(es).

In differing example embodiments, the decoder can be realized by and/or comprise a computer which executes coded instructions stored on computer readable media and a memory wherein an expurgation pattern is stored. In another example embodiment, the decoder comprises a circuit, e.g., a semiconductor or hardware circuit such as an application specific integrated circuit.

In an example embodiment, the decoder is configured to utilize an expurgation pattern listed in any of Table 1, Table 2, or Table 3, for an associated code rate in Table 1, Table 2, or Table 3.

In another of its aspects the technology disclosed herein concerns a decoding method, e.g., a method suitable for decoding a bit sequence which has been encoded using one or both of convolutional codes or convolutional turbo codes. In various embodiments and modes the decoding method comprises receiving an encoded bit sequence; using bits of the encoded bit sequence to determine state transition branches included in a trellis path to a surviving node of the trellis; and using an expurgation pattern to discard selected state transition branch(es) that correspond to input bit(s) having a predetermined value when determining the surviving node of the trellis and thereby determining a decoded bit sequence.

As yet another aspect, the technology disclosed herein concerns a communications unit which transmits an encoded bit sequence over a radio interface. The communications unit comprises a source of an input bit sequence; a transmitter; and encoder (either a convolutional turbo encoder or a convolutional encoder as encompassed by embodiments described herein). The encoder is connected to receive the input bit sequence and the transmitter is connected to receive the encoded bit sequence from the encoder and configured to transmit the encoded bit sequence on a communications channel over which the transmitting communications unit and receiving communications unit communicate with one another.

As yet another aspect, the technology disclosed herein concerns a communications unit which receives an encoded bit sequence over a radio interface. The communications unit comprises a receiver and a decoder encompassed by embodiments described herein. The receiver is configured to receive the encoded bit sequence over the communications channel and the decoder is connected to receive the encoded bit sequence from the receiver.

The communications units described herein which utilize one or more of the encoders and decoders described herein can be employed in a radio access network. For example, the communications units can comprise a radio base station (e.g., eNodeB or Bnode) or a wireless terminal (user equipment unit (UE) or mobile station) which communicate over a radio interface.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

DETAILED DESCRIPTION

In the following description, for purposes of explanation and not limitation, specific details are set forth such as particular architectures, interfaces, techniques, etc. in order to provide a thorough understanding of the present invention. However, it will be apparent to those skilled in the art that the present invention may be practiced in other embodiments that depart from these specific details. That is, those skilled in the art will be able to devise various arrangements which, although not explicitly described or shown herein, embody the principles of the invention and are included within its spirit and scope. In some instances, detailed descriptions of well-known devices, circuits, and methods are omitted so as not to obscure the description of the present invention with unnecessary detail. All statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that block diagrams herein can represent conceptual views of illustrative circuitry embodying the principles of the technology. Similarly, it will be appreciated that any flow charts, state transition diagrams, pseudocode, and the like represent various processes which may be substantially represented in computer readable medium and so executed by a computer or processor, whether or not such computer or processor is explicitly shown.

The functions of the various elements including functional blocks labeled or described as "computer", "processor" or "controller" may be provided through the use of dedicated hardware as well as hardware capable of executing software in the form of coded instructions stored on computer readable medium. A computer is generally understood to comprise one or more processors and/or controllers, and the terms computer and processor may be employed interchangeably herein. When provided by a computer or processor, the functions may be provided by a single dedicated computer or processor, by a single shared computer or processor, or by a plurality of individual computers or processors, some of which may be shared or distributed. Such functions are to be understood as being computer-implemented and thus machine-implemented. Moreover, use of the term "processor" or "controller" shall also be construed to refer to other hardware capable of performing such functions and/or executing software, and may include, without limitation, digital signal processor (DSP) hardware, reduced instruction set processor, hardware (e.g., digital or analog) circuitry, and (where appropriate) state machines capable of performing such functions.

Encoding

Figure 4:
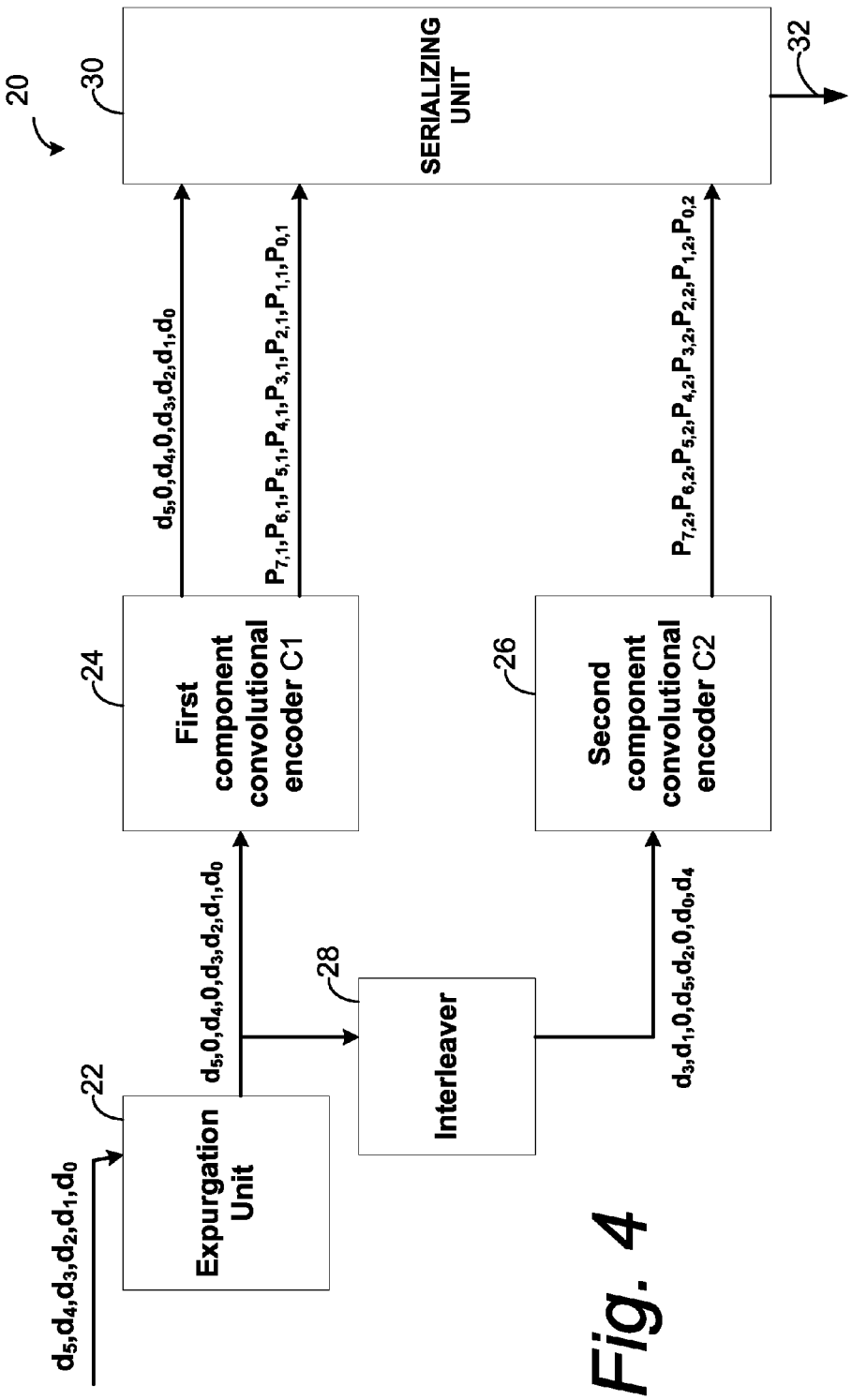
FIG. 4 is a schematic view of an expurgating convolutional turbo encoder according to an example embodiment.

FIG. 4 shows an expurgating convolutional turbo encoder 20 according to an example embodiment. The expurgating convolutional turbo encoder 20 comprises expurgation unit 22; first component convolutional encoder section 24; second component convolutional encoder section 26; interleaver 28; and output serializer 30. As explained herein, expurgation unit 22 is configured to insert predetermined values (e.g., additional zero bits) at selected bit positions of an input bit sequence and thereby provide an expurgated input bit sequence. The first component convolutional encoder section 24 is connected to receive the expurgated input bit sequence from expurgation unit 22 and is configured to use the expurgated input bit sequence to perform a first convolutional encoding operation and thereby provide a systematic bit sequence and a first parity bit sequence. The interleaver 28 is connected between the expurgation unit 22 and the second component convolutional encoder section 26 and is configured to receive the expurgated input bit sequence and to provide an interleaved expurgated input bit sequence. The second component convolutional encoder section 26 is connected to receive an interleaved expurgated input bit sequence and is configured to perform a second convolutional encoding operation using the interleaved expurgated input bit sequence and thereby yield a second parity bit sequence. As a result of its operation, expurgating convolutional turbo encoder 20 derives a lower rate convolutional turbo code (comprising the systematic bit sequence, the first parity bit sequence, and the second parity bit sequence from a higher rate code (the mother code) via expurgation.

Figure 3:
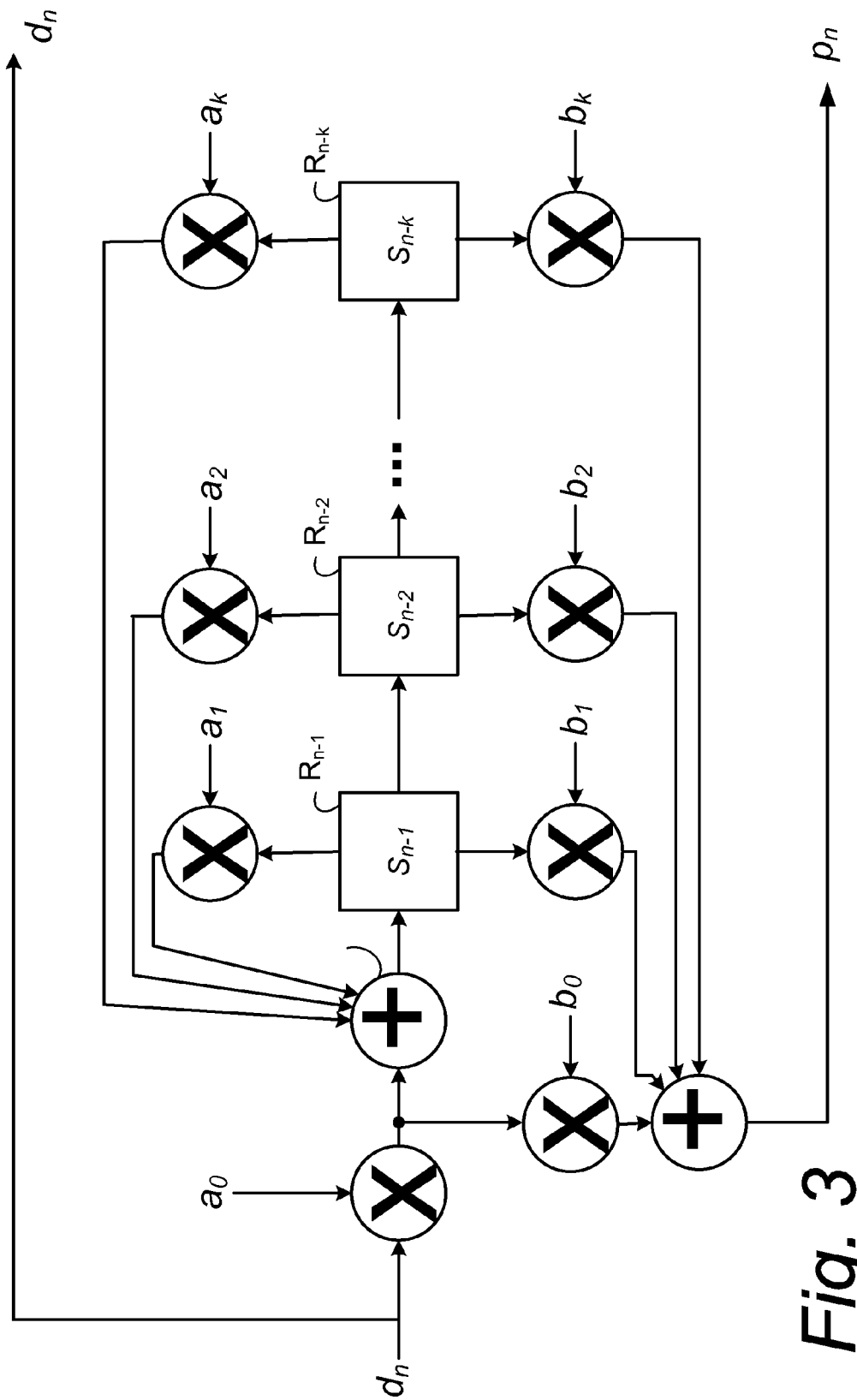
FIG. 3 is a diagrammatic view of a rate-1/2 recursive systematic convolutional encoder.

FIG. 4 shows an input bit sequence having 6 bits ($d_0$, $d_1$, $d_2$, $d_3$, $d_4$, $d_5$) and component convolutional encoders 24 and 26 which have rate 1/2 like the encoder of FIG. 3. The expurgation unit 22 inserts two zeros to the input bit sequence and the length-eight expurgated input bit sequence ($d_0$, $d_1$, $d_2$, $d_3$, 0, $d_4$, 0, $d_5$) is generated. Recall that in FIG. 3, two bits (systematic bit $d_0$ and parity bit $p_n$) are outputted for each input bit $d_n$. Therefore for the first component convolutional encoder section 24 of FIG. 4, eight expurgated input bits ($d_0$, $d_1$, $d_2$, $d_3$, 0, $d_4$, 0, $d_5$) and eight parity bits ($P_{0,1}$, $P_{1,1}$, ..., $P_{7,1}$) are outputted from first component convolutional encoder section 24. For second component convolutional encoder section 26, only eight parity bits ($P_{0,2}$, $P_{1,2}$, ..., $P_{7,2}$) are outputted. The eight interleaved expurgated input bits ($d_3$, $d_1$, 0, $d_5$, $d_2$, 0, $d_0$, $d_4$) are not outputted from second component convolutional encoder section 26 as they are permutation-equivalent to the output ($d_0$, $d_1$, $d_2$, $d_3$, 0, $d_4$, 0, $d_5$) from first component convolutional encoder section 24.

The output serializer 30 receives the eight expurgated input bits ($d_0$, $d_1$, $d_2$, $d_3$, 0, $d_4$, 0, $d_5$) and eight parity bits ($P_{0,1}$, $P_{1,1}$, ..., $P_{7,1}$) [the first parity bit sequence] which are outputted from first component convolutional encoder section 24 as well as the eight parity bits ($P_{0,2}$, $P_{1,2}$, ..., $P_{7,2}$) [the second parity bit sequence] which are output from second component convolutional encoder section 26. The output serializer 30 is configured to determine an order for transmitting these bits over channel 32. Given a desired order of discharge of bits from output serializer 30, the person skilled in the art knows how to construct and operate the output serializer 30, which can take the form of a demultiplexer or gate, for example.

Figure 5:
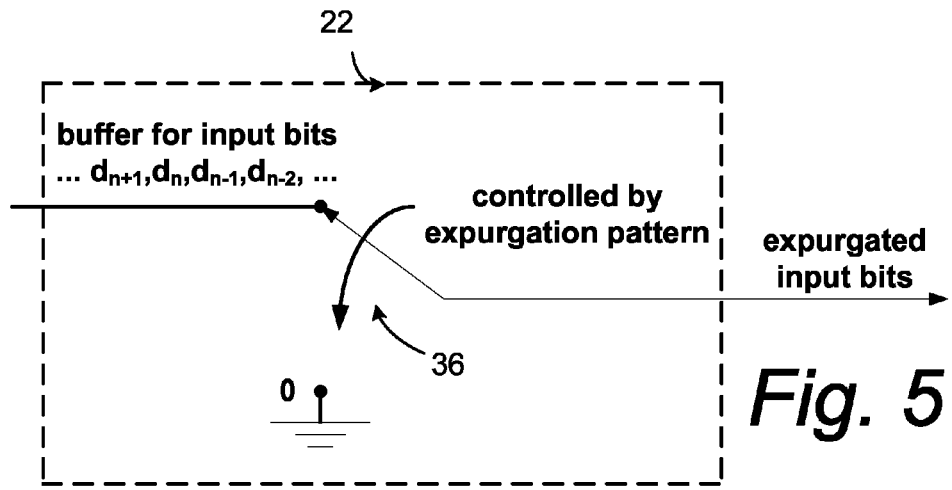
FIG. 5 is a schematic view of an example embodiment of an expurgation unit for an example convolutional turbo encoder.

FIG. 5 shows an example embodiment of expurgation unit 22. As shown in FIG. 5, expurgation unit 22 can, in an example embodiment, comprise a gate or selector 36 which is operated to select as its input either a next bit of the input bit sequence or a predetermined bit value, e.g., zero. Thus, expurgation unit 22 can insert predetermined values (e.g., zero) at selected bit positions of an input bit sequence and thereby provide an expurgated input bit sequence. The gate or selector 36 is operated in accordance with the expurgation pattern chosen as appropriate for the code.

Figure 1:
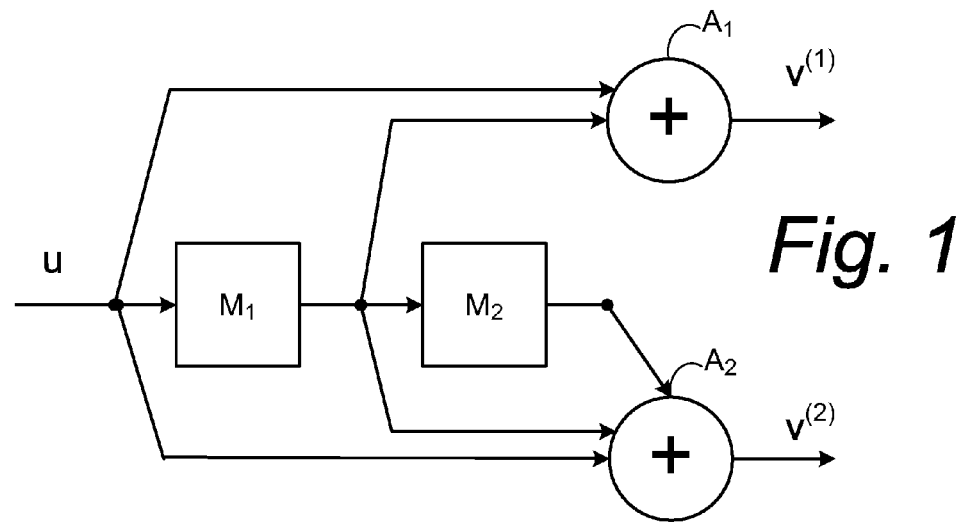
FIG. 1 is a diagrammatic view of an example rate-1/2 encoder.

As understood with reference, e.g., to FIG. 4 and FIG. 5, the encoding of an expurgated convolutional code can be performed by inserting zeros into the information sequence to reduce the length of the information sequence being used in the encoding process. For example, consider the encoder shown in FIG. 1 encoding a sequence of length 12 bits using tail-biting. The encoder output would be 24 bits and the overall rate would be 12/24 or 1/2. However, an expurgated code may be generated with a lower rate by setting some of the information bits in the 12 bit sequence to zero. For example, set one bit in the sequence to zero. Now, 24 encoded bits are generated based on 11 information bits, thus producing an overall coding rate of 11/24. A greater number of bits may similarly be set to zero to produce a whole slew of rates.

It should be noted that for a given number of zeroed bits, different codes may be generated by choosing different positions for the zeroed out information bits. Also, the bits may be chosen to be zeroed out in some uniform pattern or in some special pattern so as to optimize the weight spectrum of the expurgated codes. The only requirement is that the expurgation pattern must be known to the receiver so that decoding operations may be carried out appropriately. For the tail-biting convolutional codes, a good expurgation pattern is to put as many zeros as possible within a window of v bits, where v is the memory of the code. Due to the circular property of TBCC, the length-v window can start from any position of the input bits.

Example implementations of a 802.16m fast feedback channel design can serve as an illustrative examples. A range of code rates from 7/60 to 12/60 is currently being considered for the fast feedback channel in IEEE 802.16m. Finding a 7/60 code with good performance is difficult. One solution is to use a good rate-1/5 tail-biting code which generates 60 encoded bits for every 12 bits (rate-12/60) and use expurgation to generate the rate-7/60 code. For TBCC, the best rate 1/5 code with memory v=7 is generated by the set of generator polynomials G=(16, 112, 556, 636, 656). It can be shown that the expurgation patterns given in Table 1 give the expurgated TBCC with the best first weight spectrum; that is, each expurgated TBCC has a best ($d_{min}$, $n_{dmin}$) pair, where $d_{min}$ is the minimum Hamming distance (should be as large as possible) and $n_{dmin}$ is the codeword multiplicity (should be as small as possible). Table 1 shows, e.g., the expurgation patterns for generating rates 7/60, 8/60, 9/60, 10/60 and 11/60 TBCC from the rate 12/60 TBCC. For example, the expurgation pattern (3,5,7,9,11) for the rate 7/60 TBCC means that the $3^{rd}$, $5^{th}$, $7^{th}$, $9^{th}$, and $11^{th}$ input bits are zeroed out. The index begins from $0^{th}$. Also, the expurgation patterns try to have as many zeros as possible with a window of v=7 bits.

Figure 6:
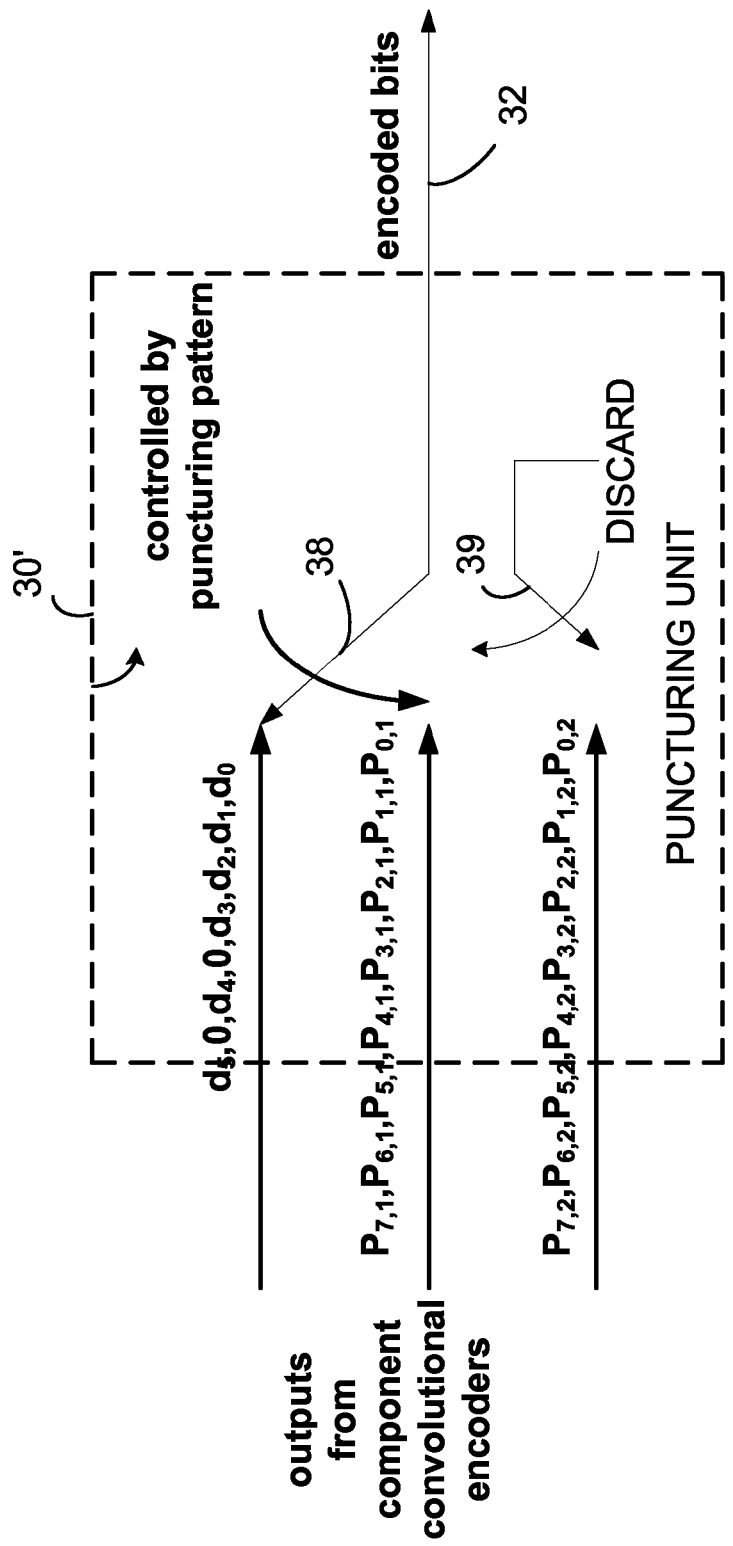
FIG. 6 is a schematic view of an example embodiment of a puncturing unit for an example convolutional turbo encoder.
Figure 7:
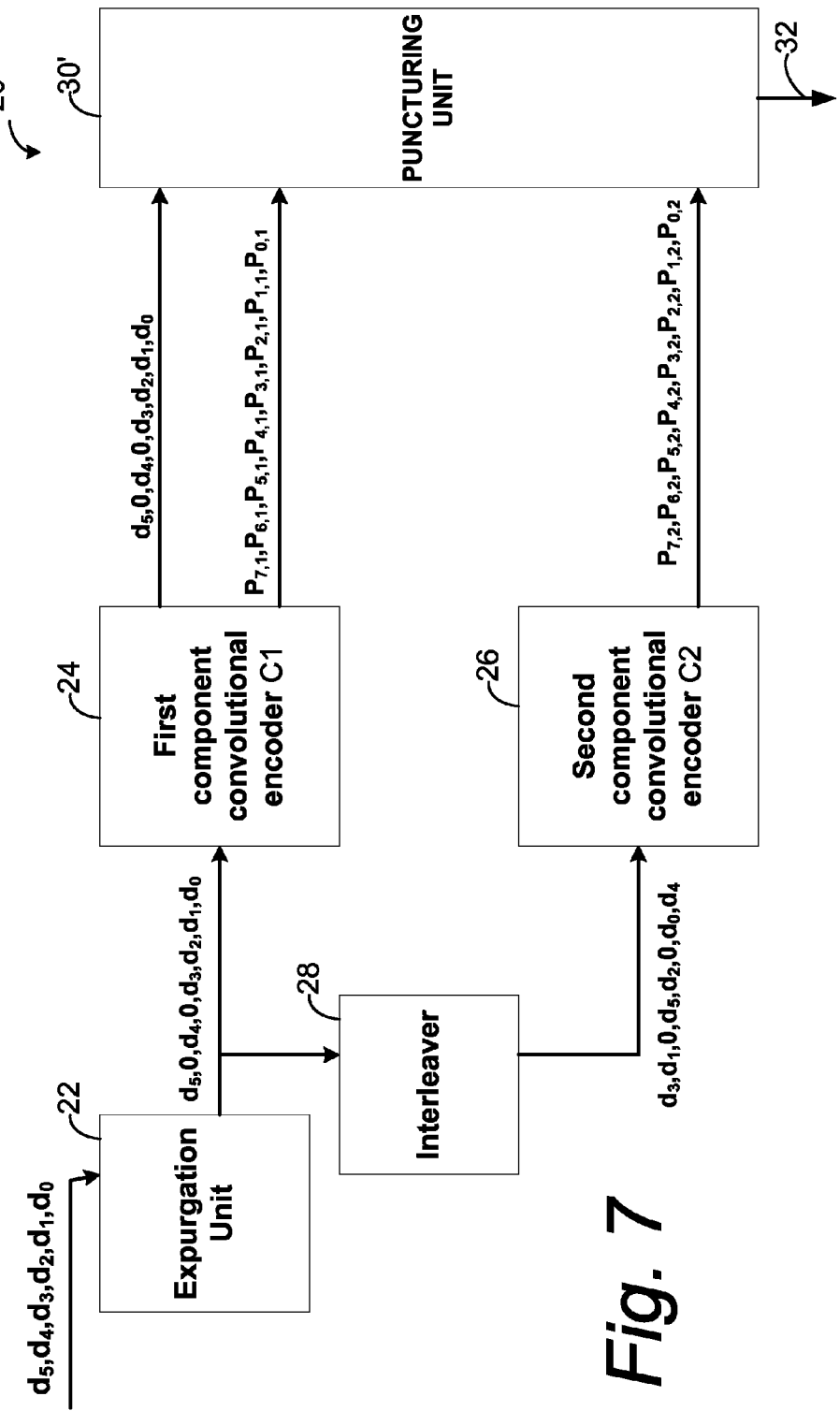
FIG. 7 is a schematic view of an expurgating convolutional turbo encoder according to another example embodiment.

FIG. 7 shows an expurgating convolutional turbo encoder 20' according to another example embodiment. The expurgating convolutional turbo encoder 20' of the embodiment of FIG. 7 differs from expurgating convolutional turbo encoder 20 of FIG. 4 in that the output serializer takes the form of puncturing unit 30'. The puncturing unit 30' serves to make a m/n rate code from a "basic" rate 1/3 code by deletion of some bits in the encoder output. FIG. 6 shows an example embodiment of puncturing unit 30' which comprises a first selector or gate 38 which selects bits from any of the three bit sequence (the systematic bit sequence, the first parity bit sequence, and the second parity bit sequence) to be applied to channel 32 as a composite encoded bit sequence, and a second selector or gate 39 which selects bits from any of the three bit sequence (the systematic bit sequence, the first parity bit sequence, and the second parity bit sequence) to be omitted or deleted (and thus not applied to channel 32 as a composite encoded bit sequence).

A range of code rates from 6/30 to 12/30 is currently being considered for the fast feedback channel in IEEE 802.16m. Finding a 6/30 code with good performance is very difficult. However, one solution is to use a good rate-12/30 tail-biting code which generates 30 encoded bits for every 12 bits (rate-12/30) and use expurgation to generate the rate-6/30 code. For TBCC, the best rate 12/30 code with memory v=6 is generated by the set of generator polynomials G=(464, 474, 670) with the puncturing pattern [1 1; 1 1; 1 0]. Such puncturing pattern can be implemented with an expurgating convolutional encoder such as the expurgating convolutional encoder 50 of FIG. 9 with its output serializer taking the form of a puncturing unit, described above. The expurgation patterns given in Table 2 give the expurgated TBCC with the best first weight spectrum. Table 2 shows, e.g., the expurgation patterns for generating rates 6/30, 7/30, 8/30, 9/30, 10/30 and 11/30 TBCC from the rate 12/30 TBCC. For example, the expurgation pattern (3,5,8,9,11) for the rate 7/30 TBCC means that the $3^{rd}$, $5^{th}$, $8^{th}$, $9^{th}$, and $11^{th}$ input bits are zeroed out. The index begins from $0^{th}$. Also, the expurgation patterns try to have as many zeros as possible with a window of v=6 bits.

A good rate-12/30 TBCC can also be obtained by puncturing the best rate-1/5 TBCC by the puncturing pattern [1 0; 0 1; 1 0; 0 1; 1 0], if the same encoder and decoder structures as the rate-1/5 TBCC are desired. Such puncturing pattern can be implemented with an expurgating convolutional encoder such as the expurgating convolutional encoder 50 of FIG. 9 with its output serializer taking the form of a puncturing unit, described above. In this case, the expurgation patterns for deriving the lower rate codes are given in Table 3. Table 3 shows, e.g., the expurgation patterns for generating rates 6/30, 7/30, 8/30, 9/30, 10/30 and 11/30 TBCC from the rate 12/30 TBCC, punctured from the rate 12/60 TBCC. For example, the expurgation pattern (3,5,7,9,10) for the rate 7/30 TBCC means that the $3^{rd}$, $5^{th}$, $7^{th}$, $9^{th}$, and $10^{th}$ input bits are zeroed out. The index begins from $0^{th}$.

Also, a range of code rates from 13/60 to 24/60 is currently being considered for the fast feedback channel in IEEE 802.16m. Finding these codes with good performance is very difficult. One solution is to use a good rate-1/5 tail-biting code and use puncturing (e.g., in the manner of FIG. 9 and FIG. 6, for example) to generate the codes with rates from 13/60 to 24/60. For Tail-biting convolutional codes (TBCC), the best rate 1/5 code with memory v=7 is generated by the set of generator polynomials G=(16, 112, 556, 636, 656). The puncturing patterns given in Table 4 give the punctured TBCC with the near-optimum or optimum first weight spectrum; that is, each expurgated TBCC has a near-optimum or optimum $(d_{min}, n_{d_{min}})$ pair, where $d_{min}$ is the minimum Hamming distance (should be as large as possible) and $n_{d_{min}}$ is the codeword multiplicity (should be as small as possible). The puncturing is performed by 2 levels. In the first-level puncturing, tail-biting convolutional codes with all or part of the generator polynomials (in the second column) from the mother code set (16,112,556,636,656) are used to encode payloads from 13 bits to 24 bits. In the second-level puncturing, some (or none) of the encoded bits from the tail-biting convolutional encoders (after the first-level puncturing) are further punctured according to the bit positions listed in the third column. Take the rate 21/60 TBCC as an example. The 21 payload bits are first encoded by the tail-biting convolutional code with the set of generator polynomials (112,556,636) and 63 encoded bits are generated (or equivalently all encoded bits generated from the first polynomial 16 and the fifth polynomial 656 are punctured, if the set (16,112,556,636,656) is used by the encoder.) The indices of the 63 encoded bits are defined as follows. The $(3k)^{th}$, $(3k+1)^{th}$, and $(3k+2)^{th}$ encoded bits are the encoder outputs from generator polynomials 112, 556, and 636, respectively, for the $k^{th}$ input payload bit, where k=0, 1, ..., 20. That is, encoded bits with indices (0, 3, 6, ..., 60) are generated by the polynomial 112, encoded bits with indices (1, 4, 7, ..., 61) are generated by the polynomial 556, and encoded bits with indices (2, 5, 8, ..., 62) are generated by the polynomial 636. During the second-level puncturing, the $0^{th}$, 27th, and $54^{th}$ encoded bits (all the three bits are generated by the polynomial 112 in this example) are further punctured and the remaining 60 encoded bits are outputted.

Table 4 thus shows the puncturing patterns for generating rates 13/60, 14/60, 15/60, 16/60, 17/60, 18/60, 19/60, 20/60, 21/60, 22/60, 23/60 and 24/60 TBCC from the rate 12/60 TBCC with the set of generator polynomials (16,112,556, 636,656). In the first-level puncturing, tail-biting convolutional codes with all or part (for example, the subset (112, 556, 636) for code rate 21/60) of the generator polynomials (in the second column) from the mother code set (16,112,556, 636,656) are used to encode payloads from 13 bits to 24 bits. In the second-level puncturing, some (or none) of the encoded bits from the tail-biting convolutional encoders (after the first-level puncturing) are further punctured according to the bit positions listed in the third column.

From the foregoing it should be understand that, in an example embodiment and additional aspect of the technology disclosed herein, the first component convolutional encoder section 24 and the second component convolutional encoder section 26 can be structured according to generator polynomials that implement a tail-biting convolutional code. Moreover, in an example embodiment and additional aspect of the technology disclosed herein, the selected bit positions can be chosen according to an expurgation pattern which provides a predetermined Hamming distance and predetermined codeword multiplicity. Yet further, in an example embodiment and additional aspect of the technology disclosed herein, the selected bit positions can be chosen according to an expurgation pattern specified by predetermined tables. For example, for a code rate listed in any of Table 1, Table 2, or Table 3, the selected bit positions can be chosen according to an expurgation pattern shown associated with the code rate in Table 1, Table 2, or Table 3.

Figure 8:
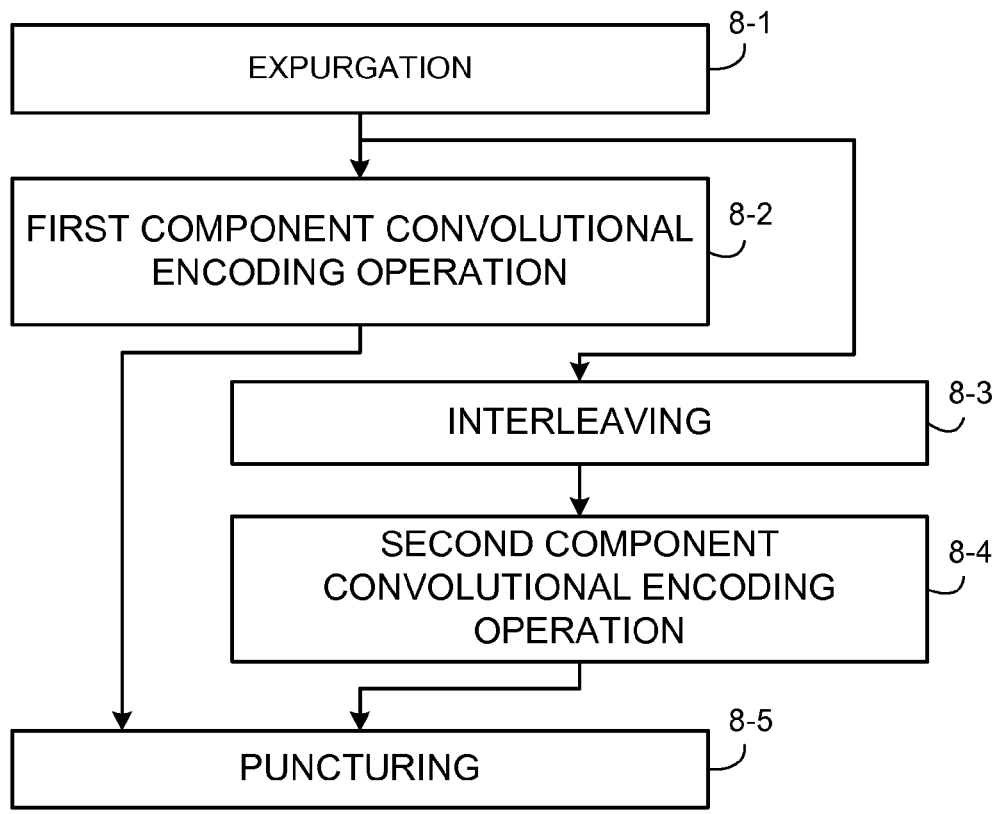
FIG. 8 is a flowchart showing basic, representative acts or steps comprising convolutional turbo encoding according to an example embodiment.

Another aspect of the technology disclosed herein concerns an encoding method. In an example embodiment and mode which concerns convolutional turbo encoding the encoding method comprises basic, representative acts or steps such as those shown in FIG. 8. The acts of FIG. 8 include expurgation (8-1); first component convolutional encoding operation (8-2); interleaving (8-3); and second component convolutional encoding operation (8-4). Optionally, in accordance with the example embodiment of FIG. 7, a further act of puncturing (8-5) can be performed.

Expurgation act (8-1) comprises expurgating an input sequence by inserting predetermined values at selected bit positions of an input bit sequence and thereby providing an expurgated input bit sequence. The first component convolutional encoding operation (8-2) comprises convoluting the expurgated input bit sequence and thereby providing a systematic bit sequence and a first parity bit sequence. The interleaving act (8-3) comprises interleaving bits of the expurgated input bit sequence and thereby providing interleaved expurgated input bit sequence. The second component convolutional encoding operation (8-4) comprises convoluting the interleaved expurgated input bit sequence and thereby providing a second parity bit sequence. The optional puncturing act (8-5) is understood from the foregoing discussion, e.g., of FIG. 6.

In an example embodiment and mode and additional aspect, the convolutional turbo encoding method further comprises using generator polynomials that implement a tail-biting convolutional code in the first convolutional encoding operation and the second convolutional encoding operation. In yet another example embodiment and mode and additional aspect, the convolutional turbo encoding method further comprises choosing the selected bit positions according to an expurgation pattern which provides a predetermined Hamming distance and predetermined codeword multiplicity. In still another example embodiment and mode and additional aspect, the convolutional turbo encoding method further comprises the selected bit positions according to an expurgation pattern shown associated with a code rate in Table 1, Table 2, or Table 3.

Figure 9:
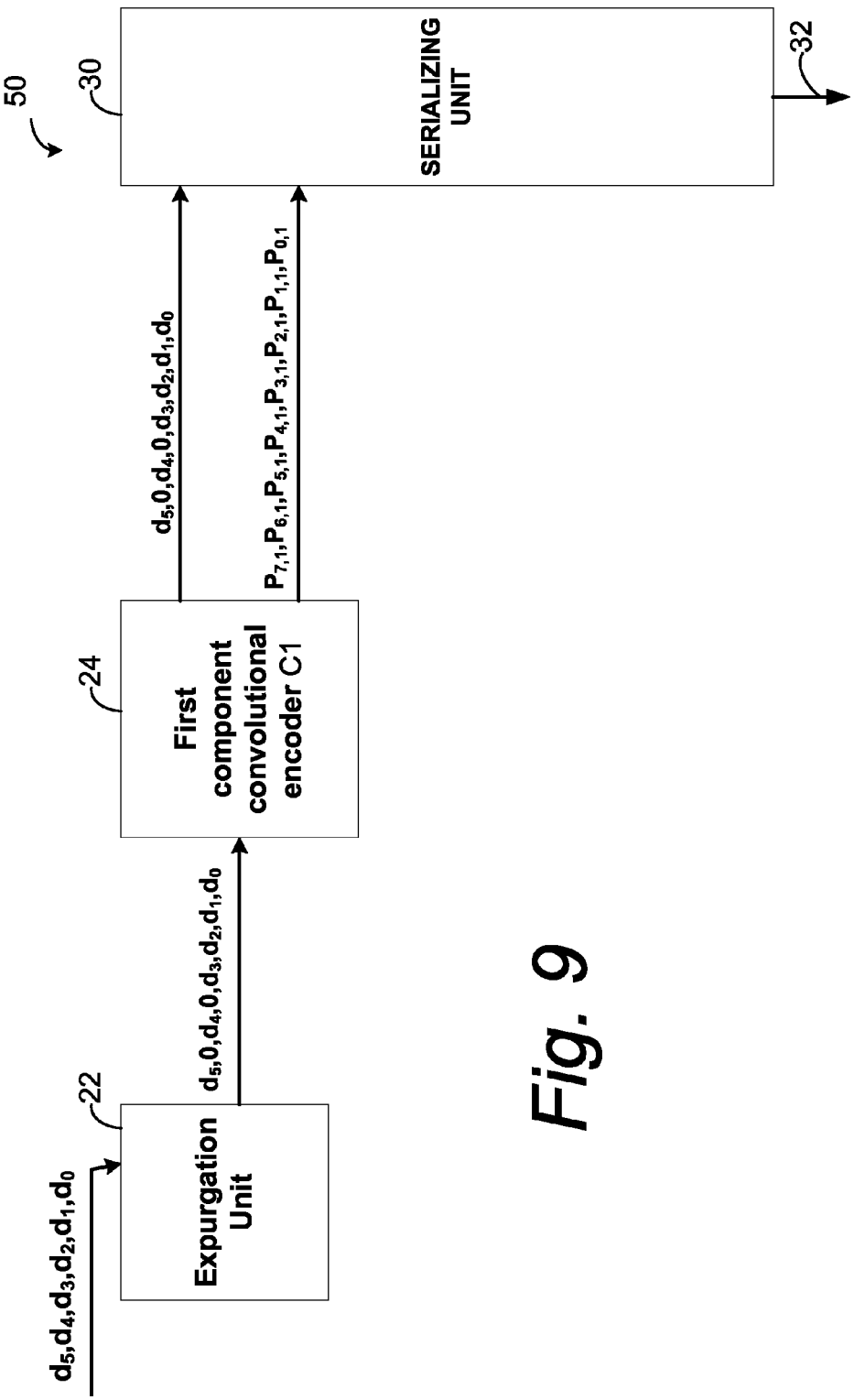
FIG. 9 is a schematic view of an expurgating convolutional encoder according to an example embodiment.

FIG. 9 shows an expurgating convolutional (non-turbo) encoder 50 according to an example embodiment. The structure and operation of a convolutional (non-turbo) encoder is more simplified than that of a convolutional turbo encoder (such as expurgating convolutional turbo encoder 20 of FIG. 4) and can be understood with reference to the convolutional turbo encoder structure and operation. The example embodiment of convolutional encoder 50 shown in FIG. 9 comprises expurgation unit 22 and first component convolutional encoder section 24, along with output serializer 30 (which can take the form of a puncturing unit). As with the convolutional turbo encoder and in the manner understood with reference to FIG. 5, expurgation unit 22 is configured to insert predetermined values at selected bit positions of an input bit sequence and thereby provide an expurgated input bit sequence. However, the expurgated input bit sequence output by the expurgation unit 22 of convolutional encoder 50 is applied only to one component convolutional encoder section, i.e., first component convolutional encoder section 24. The first component convolutional encoder section 24 is connected to receive the expurgated input bit sequence and configured to use the expurgated input bit sequence to perform a first convolutional encoding operation and thereby provide a systematic bit sequence and a first parity bit sequence. A lower rate convolutional code (comprising the systematic bit sequence and the first parity bit sequence is thereby from a higher rate code (the mother code) via expurgation.

As with the convolutional turbo encoder, the first component convolutional encoder section of the convolutional encoder can be structured according to generator polynomials that implement a tail-biting convolutional code. Furthermore, in an example embodiment and additional aspect, the selected bit positions can be chosen according to an expurgation pattern which provides a predetermined Hamming distance and predetermined codeword multiplicity. As with the convolutional turbo encoder, in an example embodiment of the convolutional encoder and additional aspect, the selected bit positions can be chosen according to an expurgation pattern specified by the aforementioned predetermined tables.

Figure 10:
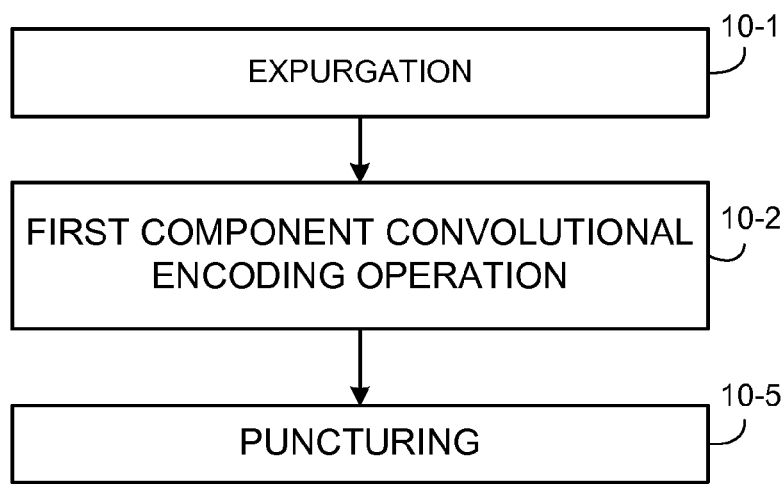
FIG. 10 is a flowchart showing basic, representative acts or steps comprising convolutional (non-turbo) encoding according to an example embodiment.

As mentioned above, one aspect of the technology disclosed herein concerns an encoding method. An example embodiment and mode which concerns the convolutional (non-turbo) encoding method is more simplified than that of a convolutional turbo encoding and can be understood with reference to convolutional turbo encoding. In an example embodiment and mode which concerns convolutional (non-turbo) encoding the encoding method comprises basic, representative acts or steps such as those shown in FIG. 10. The acts of FIG. 10 include expurgation (10-1); first component convolutional encoding operation (10-2); and (optionally) a further act of puncturing (10-5) can be performed (see, e.g., the example embodiment of FIG. 7 and FIG. 6). As explained previously, expurgation act (10-1) comprises expurgating an input sequence by inserting predetermined values at selected bit positions of an input bit sequence and thereby providing an expurgated input bit sequence. The first component convolutional encoding operation (10-2) comprises convoluting the expurgated input bit sequence and thereby providing a systematic bit sequence and a first parity bit sequence. The optional puncturing act (10-5) is understood from the foregoing discussion, e.g., of FIG. 6.

As with the convolutional turbo encoding method, the (non-turbo) convolutional encoding method can comprise using generator polynomials that implement a tail-biting convolutional code in the first convolutional encoding operation. Furthermore, in an example embodiment and additional aspect, the convolutional encoding method can comprise choosing the selected bit positions according to an expurgation pattern which provides a predetermined Hamming distance and predetermined codeword multiplicity. As with the convolutional turbo encoding, in an example embodiment of the convolutional encoding and additional aspect, the selected bit positions can be chosen according to an expurgation pattern specified by the aforementioned predetermined tables.

As understood from the foregoing, encoding of a convolutional turbo code at a lower coding rate is carried out by setting some of the bits in the information sequence input to a turbo-encoder to zero. The principles for encoding are similar to those of convolutional encoding as described above. A turbo-encoder (such as expurgating convolutional turbo encoder 20 of FIG. 4) has two component convolutional encoders. The information sequence is directly input to one of the encoders while the information sequence is interleaved before being input to the second component encoder. It should be noted that the operation of setting information bits to zero is carried out before the interleaving operation so that the zeroing out of information bits (e.g., by expurgation unit 22) is carried out at the input to the overall turbo-encoder.

Figure 11:
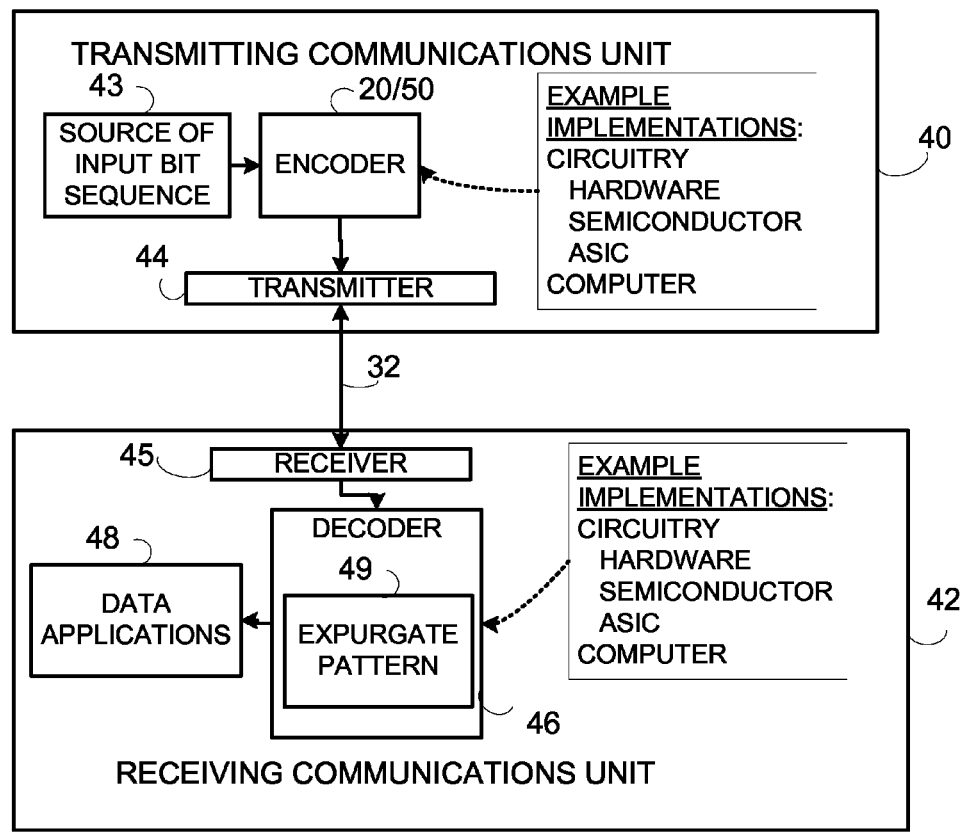
FIG. 11 is a diagrammatic view of portions of a communication network including a transmitting communications unit and a receiving communications unit.

FIG. 11 shows portions of a communication network including an example transmitting communications unit 40 and an example receiving communications unit 42. The transmitting communications unit 40 transmits encoded data over channel 32 to receiving communications unit 42. Communications unit 40 comprises source 43 of an input bit sequence; transmitter 44; and an encoder. The encoder of transmitting communications unit 40 can be either an expurgating convolutional turbo encoder (such as expurgating convolutional turbo encoder 20 of FIG. 4) or a convolutional encoder (such as expurgating convolutional encoder 50 of FIG. 9), or any other encoder encompassed by embodiments described herein, and thus is depicted as encoder 20/50 in FIG. 11. The encoder 20/50 is connected to receive the input bit sequence from source 43 and transmitter 44 is connected to receive the encoded bit sequence from the encoder 20/50 and configured to transmit the encoded bit sequence over data channel 32. It should be understood that transmitting communications unit 40 can include many other functionalities and units depending on the field of employment.

The example receiving communications unit 42 of FIG. 11 receives the encoded bit sequence over communications channel 32. The receiving communications unit 42 of FIG. 11 comprises receiver 45, decoder 46, and one or more data applications 48. Receiver 45 is configured to receive the encoded bit sequence over the communications channel 32 and decoder 46 is connected to receive the encoded bit sequence from receiver 45. Decoder 46 is configured to decode received bit sequences which are encoded using any convolutional code or convolutional turbo code which is described by embodiments hereof or otherwise encompassed hereby. Operation of an example decoder 46 is below described, e.g., with reference to FIG. 12.

Thus, transmitting communications unit 40 and receiving communications unit 42 generically represent units or devices of many application or technological fields which communicate over a communications channel using a convolutional code or a convolutional turbo code. An illustrative, non-limiting example data communications field involving encoding of data transmitted in a network over a radio or wireless interface is below described with reference to FIG. 14. In whatever field or application of employment, the encoder 20/50 and the decoder 46 can be realized or embodied in several ways.

As one non-limiting example implementation, both encoder 20/50 and decoder 46 can be implemented by circuitry. Example circuit implementations include circuitry embodiments and computerized embodiments.

The circuitry embodiments include hardware circuitry, semiconductor circuitry, one or more application specific integrated circuits [ASIC], or any hybrid or combination thereof. The circuit components and layout thereof for encoder 20/50 and decoder 46 are dependent upon such factors (design and otherwise) as the particular convolutional code and generator polynomials which are employed, the expurgation pattern, and the nature and extent of puncturing which may be employed.

An example layout of a representative component convolutional encoder section has been shown in FIG. 3. The person skilled in the art understands how to construct and interconnect components (either hardware, semiconductor, or ASIC) and operate such component convolutional encoder section for either first component convolutional encoder section 24 and/or second component convolutional encoder section 26 in dependence upon the design parameters, and how to interconnect such component convolutional encoder section(s) with other aspects of the expurgating convolutional turbo encoder 20 of FIG. 4 or the expurgating convolutional encoder 50 of FIG. 9. Example layouts of expurgation unit 22 and puncturing unit 30' have also been discussed and illustrated with respect to FIG. 5 and FIG. 6, respectively. The person skilled in the art knows to construct and interconnect these circuit elements according to the chosen circuitry fabrication technology. The person skilled in the art is well acquainted with interleavers and interleaving techniques and thus able to construct and include in the circuit an appropriate interleaver 28 of choice.

Operation of decoder 46 is subsequently described, particularly with reference to FIG. 12. In an example embodiment and mode the decoding operation essentially involves a trellis search. The person skilled in the art knows how to construct and interconnect in circuitry trellis-searching decoders. Given the decoding strategy and criteria described herein, the person skilled in the art can fabricate in circuitry an appropriate trellis-searching decoder suitable for decoding the received encoded bit sequence in dependence upon the design criteria (e.g., the expurgation pattern) for the encoding and decoding.

In some example embodiments one or more of encoder 20/50 and decoder 46 can be computer-implemented. For example, the encoding methods described herein can be implemented by a computer that has been programmed with machine-readable instructions stored on a machine-readable medium that cause the computer to function as an encoder apparatus that generates an encoded bit sequence from an input bit sequence, which method comprises encoding, by executing the instructions in the computer, the input bit sequence into the encoded bit sequence, and outputting the encoded bit sequence. For example, the encoder 20/50 can comprise a computer; a memory; wherein the first component convolutional encoder section 24, the second component convolutional encoder section 26, and the expurgation unit 22 are implemented by the computer; and wherein the selected bits are chosen according to an expurgation pattern which is stored in the memory.

Similarly, the decoding methods described herein can be implemented by a computer that has been programmed with machine-readable instructions stored on a machine-readable medium that cause the computer to function as a decoder apparatus that generates a decoded bit sequence from an encoded bit sequence, which method comprises decoding, by executing the instructions in the computer, the encoded bit sequence into the decoded bit sequence, and outputting the decoded bit sequence for use by an application program or the like or device or peripheral.

The computers which function as the encoder 20/50 and the decoder 46 thus can comprise one or more processor(s) or controller(s) as those terms are herein expansively described, as well as memory(ies) and input/output devices (visual input/output [display(s)], keyboard, pointer/mouse, audio input/output). The memory(ies) can take various forms such as read-only memory (ROM), random access memory (RAM), semiconductor memory, cache memory and can store the executable instructions as well as the expurgation pattern described herein.

Whether implemented by circuitry or computer, it should be understood that functions of encoder 20/50 and/or decoder 46 can be distributed over one or more circuits or computers/processors, and that such circuits and/or computers/processors may perform other functions on behalf of the transmitting communications unit 40 or receiving communications unit 42 in addition to the encoding or decoding operations described herein.

Decoding

In some of its aspects the technology disclosed herein concerns a decoder, e.g., a decoder suitable for decoding a bit sequence which has been encoded using one or both of convolutional codes or convolutional turbo codes such as those described above. As shown by way of example in FIG. 11, the decoder is connected to receive an encoded bit sequence and configured to use an expurgation pattern (i.e., the expurgation pattern which was utilized to generate the encoded bit sequence) to determine a decoded bit sequence from the encoded bit sequence. FIG. 11 shows by symbol 49 the decoder 46 having knowledge of the expurgation pattern ("expurgate pattern"), which expurgation pattern can be stored in memory or implemented by circuitry as discussed herein.

Figure 13:
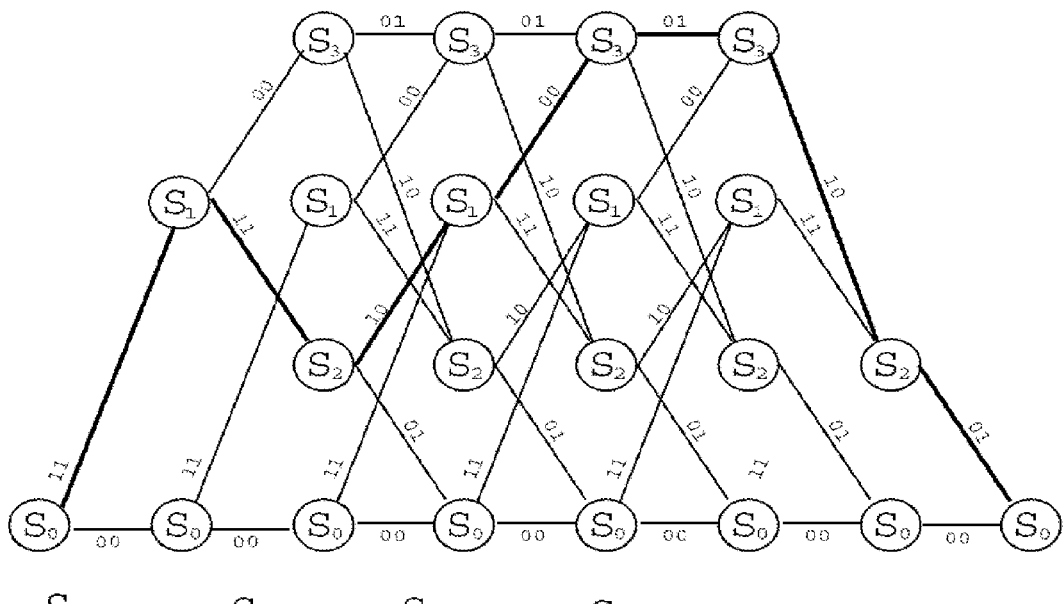
FIG. 13 is a diagrammatic view of a trellis representing information and encoded sequences.
Figure 2:
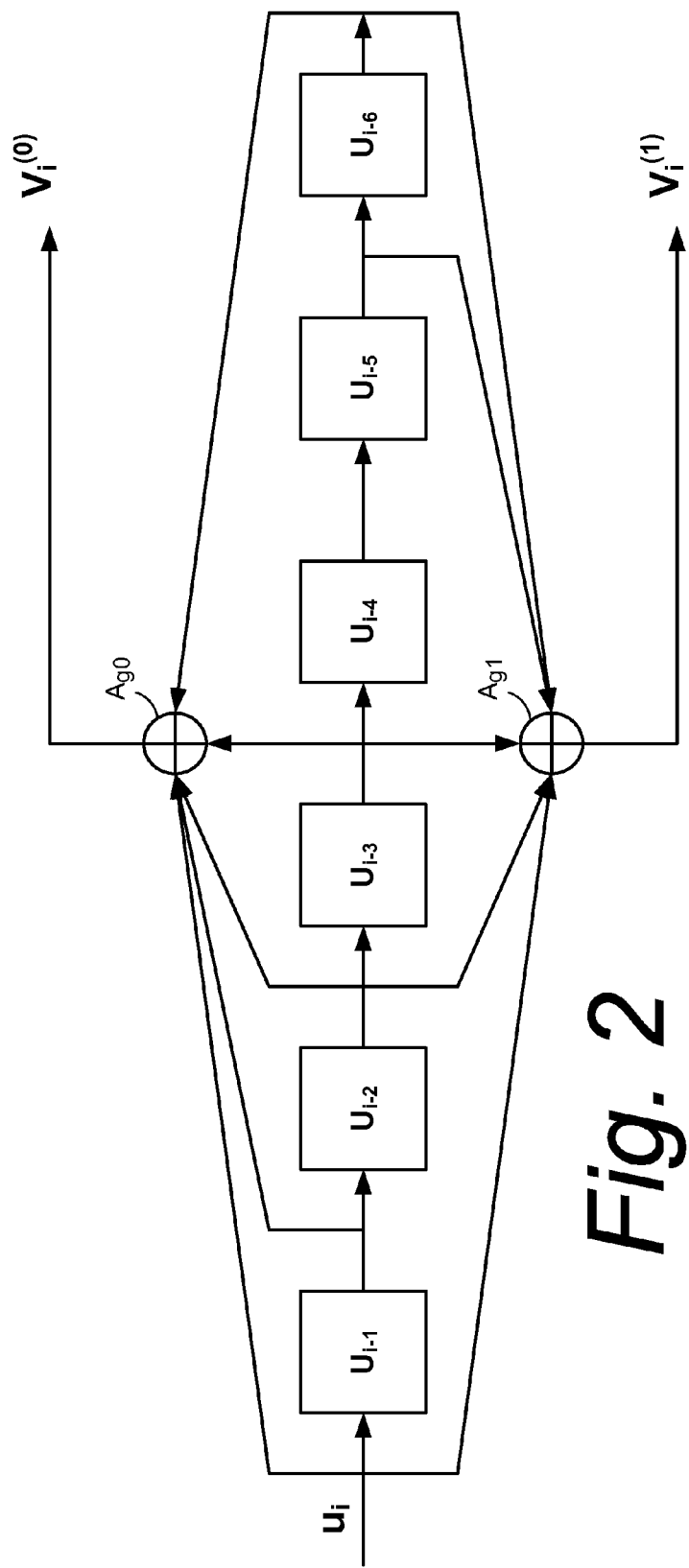
FIG. 2 is a diagrammatic view of an example encoder for a Tail-biting convolutional code (TBCC) having code rate $1/n=1/2$, constraint length $v=6$, and $G=(g_0,g_1)$, where $g_0=(1, 1, 1, 1, 0, 0, 1)$ and $g_1=(1, 0, 1, 1, 0, 1, 1)$.

Thus, as understood by the person skilled in the art, maximum-likelihood decoding of convolutional codes may be carried out using a trellis diagram. An example of a trellis diagram is shown in FIG. 13. A trellis has nodes that represent the states that the encoder may be in at any given time. In the trellis diagram of FIG. 13, all of the possible states are lined up along the horizontal axis. Each state is connected to the next state by the allowable codewords for that state. There are only two output choices possible at each state. These output choices are determined by the arrival of either a 0 or a 1 bit. The arrows going upwards represent a 0 bit and arrows going downwards represent a 1 bit. The trellis diagram is unique to each code. Thus, the encoder in FIG. 1 has two memory elements and hence may be in any one of four states as shown in FIG. 13. The encoder may transition from a given state at a time step to another state at the next time step based on the input to the encoder. For the rate-1/2 encoder, the input consists of one bit which may take the values of 0 or 1. Hence, the trellis has two paths going out of and into each state. The upper path represents an input of 0 and the lower path represents an input of 1. The labels in FIG. 13 on each branch signify the two bits that are output by the encoder as the result of being in a particular state and receiving a particular input bit.

Decoding using this trellis is carried out by comparing the received symbols for each time step to the output corresponding to each of the paths. A distance metric may then be used to rank the likelihood of the transmitted symbols corresponding to the output on each branch. At each time step, the metrics are computed for all incoming paths into each of the four states. The paths with the lower metrics are discarded and the paths with the higher metrics are retained. At the next time step, the metrics for the retained paths are updated for each of the branches out of the states at the previous time step with each branch corresponding to a one or zero input. The process of discarding the paths with the lower metrics is then repeated. Thus, decoding using the trellis above with repeated operations at each time step in effect compares all possible encoded sequences to the received symbols and chooses the most likely information sequence that was transmitted.

Figure 12:
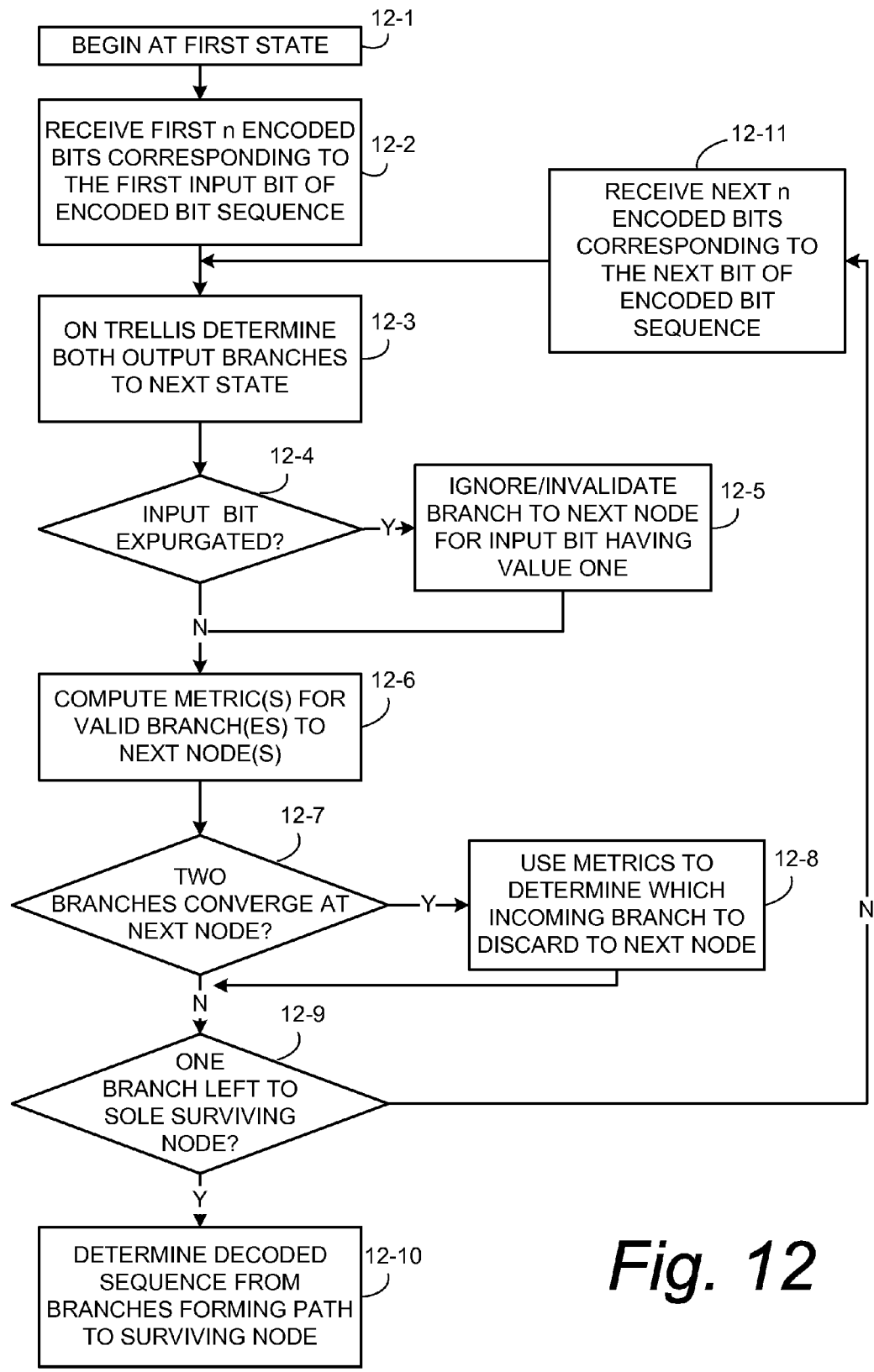
FIG. 12 is a flowchart depicting basic, representative acts or steps performed by a schematic view of an expurgated decoder according to an example embodiment.

In one example embodiment described with respect to FIG. 12, the decoder 46 is configured to receive the encoded bit sequence and to determine therefrom the decoded bit sequence by determining state transition branches included in a trellis path to a surviving node of the trellis. As explained herein, decoder 46 is preconfigured to use the expurgation pattern 49 to discard selected state transition branch(es) that correspond to input bit(s) having a predetermined value when determining the surviving node of the trellis.

In the example mode and decoding method of FIG. 12, act 12-1 reflects the decoding operation beginning at first state. Act 12-2 comprises receiving the first n encoded bits corresponding to the first input bit. Act 12-3 comprises determining, on the appropriate trellis for the code, both output branches to a next state. Act 12-4 comprises determining, with reference to the expurgation pattern 49, whether the incoming input bit was expurgated by the encoder (e.g., whether a predetermined value [e.g., zero] was inserted in the original bit sequence by the decoder). If consultation with expurgation pattern 49 indicates that the incoming input bit was expurgated, as act 12-5 the decoder ignores or invalidates the branch to the next node of the next state for the input bit having a value of one. After act 12-5 or act 12-4, as act 12-6 the decoder computes a metric(s) for the valid branch(es) to the next node(s). If the determination of act 12-4 was affirmative, there will be only one valid branch to the next node. Act 12-7 comprises determining whether two branches converge at the next node. If two branches do converge at the next node, as act 12-8 the decoder uses metrics to determine which incoming branch to discard to the next node. After act 12-8 or act 12-7, as act 12-9 the decoder determines whether only one branch is left to a sole surviving node. If only one branch is left to a sole surviving node, then as act 12-10 the decoder determines the decoded bit sequence from the branches that collectively form a path to the surviving node. If the test of act 12-9 is not satisfied, execution jumps to act 12-11 for receiving the next n encoded bits corresponding to the next input bit. The decoding then continues with that next n bit of the encoded bit sequence then being processed by acts 12-3 et seq in the manner previously described.

Thus, when decoding expurgated codes, the receiving communication unit (e.g., decoder 46) has knowledge (via expurgation pattern 49) of the information bits that were zeroed out at the transmitter. This allows the decoder to invalidate certain state transitions during the decoding process. For instance, if the third information bit is set to zero, then all the state transitions at time step 3 in the decoding process that correspond to an input bit having value 1 are not considered. This may be achieved by setting the branch metrics for this branch to be very high (or low depending on whether the path metrics are being minimized or maximized). Alternately, if the branch metrics incorporate the apriori probability of an information bit being zero or one, this apriori probability corresponding to a value of 1 may be set to zero for the bits zeroed out in the information sequence. The component decoder for a turbo-encoder needs to use such apriori probabilities and thus, this method is suitable for turbo-decoding of expurgated turbo-codes.

In an example implementation, the decoder 46 discards the selected state transition branch(es) by assigning a discard-causing metric(s) to the selected state transition branch(es). In another implementation, the decoder is configured to discard the selected state transition branch(es) by assigning a discard-causing apriori probability value(s) to the selected state transition branch(es). In yet another embodiment, the decoder can be configured to ignore a fact that selected bits in the input sequence as applied to a convolutional encoder were set to zero in accordance with the expurgation pattern but is configured to detect and discard the selected bits to provide the decoded bit sequence.

For simplicity only the decoding algorithm for the zero-tail convolutional code has been considered in FIG. 12. The person skilled in the art will appreciate that but the same principles (regarding using the expurgation pattern in the decoder) apply to decoder for tail-biting convolutional codes, which can be found in the U.S. patent application Ser. No. 12/140,956, entitled REDUCED-COMPLEXITY DECODING ALGORITHMS FOR TAIL-BITING CONVOLUTIONAL CODES.

As explained above, in differing example embodiments, the decoder can be realized by and/or comprise a computer which executes coded instructions stored on computer readable media and a memory wherein an expurgation pattern is stored. In another example embodiment, the decoder comprises a circuit, e.g., a semiconductor or hardware circuit or an application specific integrated circuit.

In an example embodiment, the decoder is configured to utilize an expurgation pattern listed in any of Table 1, Table 2, or Table 3, for an associated code rate in Table 1, Table 2, or Table 3.

In another of its aspects the technology disclosed herein concerns a decoding method, e.g., a method suitable for decoding a bit sequence which has been encoded using one or both of convolutional codes or convolutional turbo codes. In various embodiments and modes such as that depicted by FIG. 12, the decoding method comprises receiving an encoded bit sequence; using bits of the encoded bit sequence to determine state transition branches included in a trellis path to a surviving node of the trellis; and using an expurgation pattern to discard selected state transition branch(es) that correspond to input bit(s) having a predetermined value when determining the surviving node of the trellis and thereby determining a decoded bit sequence.

Example Telecommunications Embodiment

Figure 14:
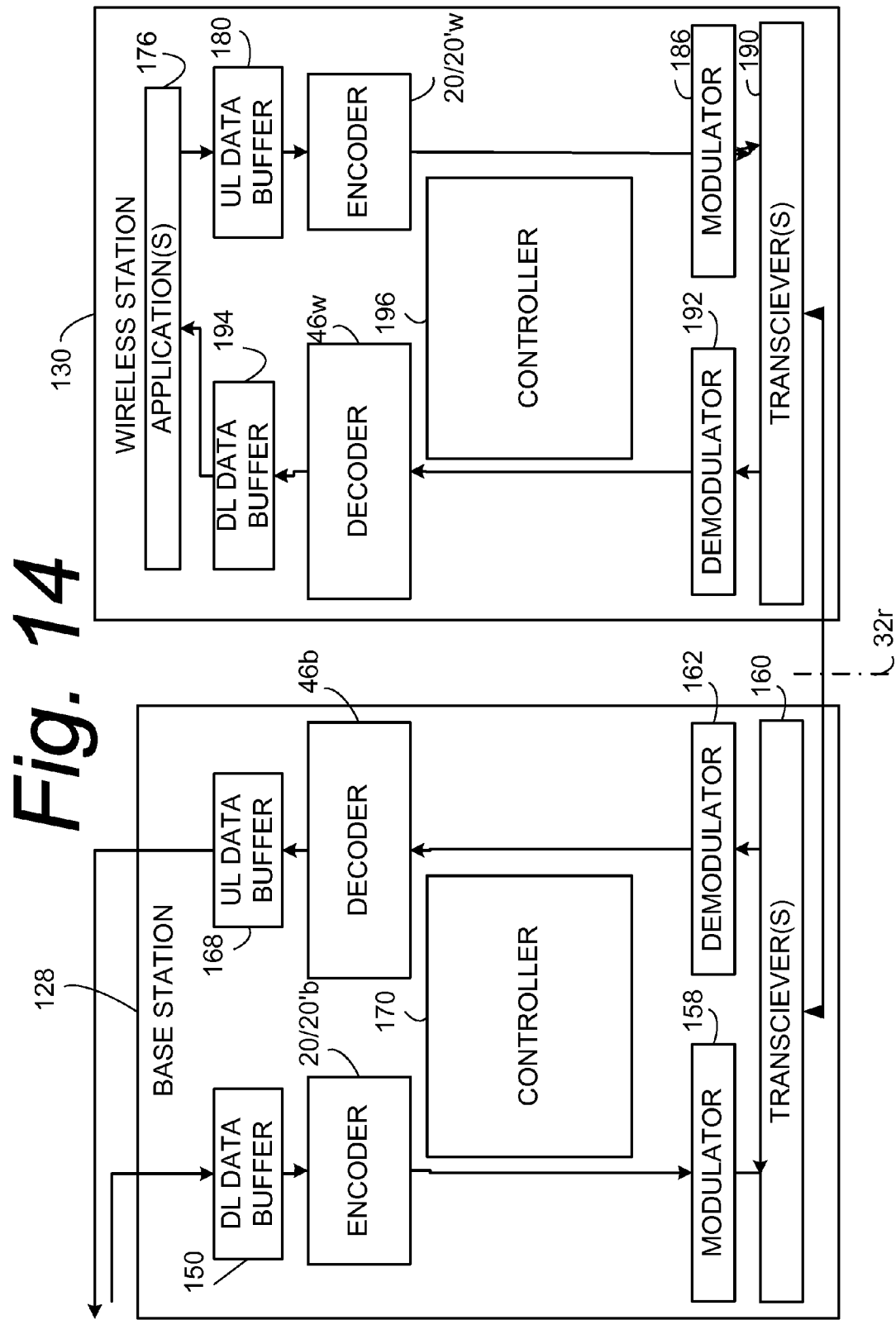
FIG. 14 is a diagrammatic view of portions of a communication network including a base station and a wireless station which communicate data over a radio channel using expurgated convolutional code(s) and/or expurgated convolutional turbo code(s) as described herein.

FIG. 14 is a diagrammatic view of portions of a communication network including an example base station (RBS or NodeB or eNodeB) and an example wireless station which communicate data over a radio channel 32r using expurgated convolutional code(s) and/or expurgated convolutional turbo code(s) as described herein. From the foregoing including FIG. 11 hereof, it should be understood that, in other communication networks which are not wireless, that the channel can be provided over a network interface which is other than wireless, e.g., a wired interface, for example.

At least some of the data which is transmitted over network interface 32r is encoded in the manner described herein. For example, at least some of the data transmitted over network interface 32r on a downlink from base station 128 to wireless station 130 can be encoded by encoder 20/20'b at base station 128, and therefore is decoded upon receipt by a decoder 46w at wireless station 130. Conversely, at least some of the data transmitted over network interface 32r on an uplink from wireless station 130 to base station 128 can be encoded by encoder 20/20'w at wireless station 130, and therefore is decoded by decoder 46b of base station 128 upon receipt by base station 128.

It should further be appreciated that the encoding operations and the decoding operations may be performed either bidirectionally or unidirectionally. That is, the encoding operations and the decoding operations may be performed both with respect to data transmitted on the downlink from base station 128 to wireless station 130 and with respect to data transmitted on the uplink from wireless station 130 to base station 128 (bidirectional traffic). On the other hand, the encoding operations and the decoding operations may be performed only with respect to one direction of traffic, e.g., either for traffic on the downlink from base station 128 to wireless station 130 or for traffic on the uplink from wireless station 130 to base station 128.

FIG. 14 further illustrates certain units or functionalities comprising base station 128. On its downlink side, base station 128 comprises base station downlink data buffer 150; base station encoder 20/20'b; base station modulator 158; and base station transceiver(s) 160. On its uplink side, base station 128 comprises base station demodulator 162; base station decoder 46b; and base station uplink data buffer 168. The base station 128 further comprises base station node controller 170, which supervises interaction of various functionalities and components and which itself can perform other or same functionalities as those illustrated.

FIG. 14 also illustrates certain units or functionalities comprising wireless station 130. Wireless station 130 executes, via a controller or the like, certain applications (e.g., application programs 176). On its uplink side, wireless station 130 comprises wireless station uplink data buffer 180, wireless station encoder 20/20'w; wireless station modulator 186; and wireless station transceiver(s) 190. On its downlink side, wireless station 130 comprises wireless station demodulator 192; wireless station decoder 46w; and wireless station downlink data buffer 194. The wireless station 130 further comprises wireless station controller 196, which supervises interaction of various functionalities and components and which itself can perform other or same functionalities as those illustrated.

As used herein, the term "transceiver" is employed to represent a device having either transmitting capabilities and/or receiving capabilities. Although communication devices can employ a transceiver to perform both transmitting and receiving, use of the term "transceiver" herein does not require that the unit be capable of or perform both transmission and reception, as indeed the term encompasses performance of only one such operation.

The technology disclosed herein thus encompasses efficient encoding and decoding operations for expurgated convolutional codes. Example aspects of the technology disclosed above comprise:

Generation of expurgated convolutional codes and convolutional turbo codes.

Efficient encoding of expurgated convolutional codes by introducing zeros into the information sequence that is input to the convolutional encoder.

Efficient decoding of expurgated codes by using the decoder for the original code from which the expurgated code is derived and by using one of the following methods:

Constraining the paths considered in the decoding trellis to only those paths that have zeros corresponding to the bits that were zeroed out in the information sequence. The constraining operation may be performed in the following ways:

By setting the branch metric in the trellis for the branches corresponding to the zeroed out bits having a value of 1, to be very high.

Using apriori probabilities of the information bits in the decoding trellis for computation of the branch metric and setting the apriori probabilities for the zeroed out bits having a value of 1 to zero. This method is particularly useful for the component decoders in an expurgated turbo code since using apriori probabilities is an integral part of turbo-decoding.

Performing decoding using the original code without any constraints on paths considered and discarding the bits that were zeroed out in the information sequence.

Example advantages of the technology disclosed herein include: use of expurgated convolutional codes and convolutional turbo codes to generate lower rate codes from higher rate codes; efficient encoding of the expurgated codes described herein; and efficient decoding of the expurgated codes described herein.

Although the description above contains many specificities, these should not be construed as limiting the scope of the invention but as merely providing illustrations of some of the presently preferred embodiments of this invention. It will be appreciated that the scope of the present invention fully encompasses other embodiments which may become obvious to those skilled in the art, and that the scope of the present invention is accordingly not to be limited. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed hereby. Moreover, it is not necessary for a device or method to address each and every problem sought to be solved by the present invention, for it to be encompassed hereby.

TABLE 1

| Code Rate | Expurgation Pattern |
| --- | --- |
| 7/60 | (3, 5, 7, 9, 11) |
| 8/60 | (5, 7, 9, 11) |
| 9/60 | (6, 9, 11) |
| 10/60 | (6, 11) |
| 11/60 | (11) |

TABLE 2

| Code Rate | Expurgation Pattern |
| --- | --- |
| 6/30 | (0, 2, 4, 6, 8, 10) |
| 7/30 | (3, 5, 8, 9, 11) |
| 8/30 | (3, 5, 8, 11) |
| 9/30 | (3, 7, 11) |
| 10/30 | (7, 11) |
| 11/30 | (11) |

TABLE 3

| Code Rate | Expurgation Pattern |
| --- | --- |
| 6/30 | (1, 2, 5, 6, 9, 10) |
| 7/30 | (3, 5, 7, 9, 10) |
| 8/30 | (2, 5, 8, 11) |
| 9/30 | (2, 6, 10) |
| 10/30 | (6, 10) |
| 11/30 | (10) |

TABLE 4

| Code Rate | first-level puncturing: the set of generator polynomials | Second-level puncturing: positions of bits to be punctured after the first-level puncturing |
| --- | --- | --- |
| 13/60 | (16, 112, 556, 636, 656) | (1, 16, 31, 46, 61) |
| 14/60 | (16, 112, 556, 636, 656) | (3, 8, 13, 18, 23, 28, 33, 38, 43, 48) |
| 15/60 | (16, 112, 636, 656) | None |
| 16/60 | (16, 112, 636, 656) | (0, 16, 32, 48) |
| 17/60 | (16, 112, 636, 656) | (0, 8, 16, 24, 32, 40, 48, 56) |
| 18/60 | (16, 112, 636, 656) | (0, 4, 8, 12, 16, 20, 24, 28, 32, 36, 40, 44) |
| 19/60 | (16, 112, 636, 656) | (0, 4, 8, 12, 16, 20, 24, 32, 36, 40, 48, 52, 56, 64, 68, 72) |
| 20/60 | (112, 556, 636) | None |
| 21/60 | (112, 556, 636) | (0, 27, 54) |
| 22/60 | (112, 636, 656) | (2, 15, 23, 31, 52, 60) |
| 23/60 | (112, 636, 656) | (0, 3, 12, 21, 30, 33, 42, 51, 60) |
| 24/60 | (112, 636, 656) | (1, 7, 13, 19, 25, 31, 37, 43, 49, 55, 61, 67) |

What is claimed is:

1. A convolutional encoder embodied in a tangible, non-transient medium, the convolutional encoder, comprising:
   an expurgation unit configured to insert predetermined values at selected bit positions of an input bit sequence and thereby provide an expurgated input bit sequence;

a first component convolutional encoder section connected to receive the expurgated input bit sequence and configured to use the expurgated input bit sequence to perform a first convolutional encoding operation and thereby provide a systematic bit sequence and a first parity bit sequence; and wherein the selected bit positions are selected in accordance with an expurgation pattern associated with an output code rate used by the convolutional encoder, wherein the output code rate and the associated expurgation pattern comprise one of:

| Code Rate | Expurgation Pattern |
|---|---|
| 7/60 | (3, 5, 7, 9, 11) |
| 8/60 | (5, 7, 9, 11) |
| 9/60 | (6, 9, 11) |
| 10/60 | (6, 11) |
| 11/60 | (11). |

2. The encoder of claim 1, further comprising a puncturing unit configured to delete selected ones of the systematic bit sequence and the first parity bit sequence prior to application to a channel.

3. The encoder of claim 1, wherein the first component convolutional encoder section and the expurgation unit comprise an application specific integrated circuit.

4. The encoder of claim 1, wherein the first component convolutional encoder section is structured according to generator polynomials that implement a tail-biting convolutional code.

5. The encoder of claim 1, wherein the convolutional encoder is a convolutional turbo encoder further comprising:
   a second component convolutional encoder section connected to receive an interleaved expurgated input bit sequence and configured to perform a second convolutional encoding operation using an interleaved expurgated input bit sequence and thereby yield a second parity bit sequence; and;
   an interleaver connected between the expurgation unit and the second component convolutional encoder section and configured to receive the expurgated input bit sequence and to provide the interleaved expurgated input bit sequence.

6. The encoder of claim 5, further comprising, a puncturing unit configured to delete selected ones of the systematic bit sequence, the first parity bit sequence, and the second parity bit sequence prior to application to a channel.

7. The encoder of claim 5, wherein the first component convolutional encoder section, the second component convolutional encoder section, the interleaver, and the expurgation unit comprise an application specific integrated circuit.

8. The encoder of claim 7, wherein the first component convolutional encoder section and the second component convolutional encoder section are structured according to generator polynomials that implement a tail-biting convolutional code.

9. An encoding method comprising:
   (1) expurgating an input sequence by inserting predetermined values at selected bit positions of an input bit sequence and thereby providing an expurgated input bit sequence; and
   (2) performing a first convolutional encoding operation on the expurgated input bit sequence and thereby providing a systematic bit sequence and a first parity bit sequence, wherein inserting predetermined values at selected bit positions comprises choosing the selected bit positions according to an expurgation pattern associated with an output code rate, and wherein the output code rate and the associated expurgation pattern comprise one of:

| Code Rate | Expurgation Pattern |
|---|---|
| 7/60 | (3, 5, 7, 9, 11) |
| 8/60 | (5, 7, 9, 11) |
| 9/60 | (6, 9, 11) |
| 10/60 | (6, 11) |
| 11/60 | (11). |

10. The method of claim 9, further comprising using generator polynomials that implement a tail-biting convolutional code in the first convolutional encoding operation.

11. The method of claim 9, further comprising:
   (3) interleaving bits of the expurgated input bit sequence and thereby providing an interleaved expurgated input bit sequence;
   (4) using the interleaved expurgated input bit sequence to perform a second convolutional encoding operation which yields a secondary parity bit sequence.

12. The method of claim 11, further comprising using generator polynomials that implement a tail-biting convolutional code in the first convolutional encoding operation and the second convolutional encoding operation.

13. A convolutional encoder embodied in a tangible, non-transient medium, the convolutional encoder, comprising:
   an expurgation unit configured to insert predetermined values at selected bit positions of an input bit sequence and thereby provide an expurgated input bit sequence;
   a first component convolutional encoder section connected to receive the expurgated input bit sequence and configured to use the expurgated input bit sequence to perform a first convolutional encoding operation and thereby provide a systematic bit sequence and a first parity bit sequence; and
   wherein the selected bit positions are selected in accordance with an expurgation pattern associated with an output code rate used by the convolutional encoder, wherein the output code rate and the associated expurgation pattern comprise one of:

| Code Rate | Expurgation Pattern |
|---|---|
| 6/30 | (0, 2, 4, 6, 8, 10) |
| 7/30 | (3, 5, 8, 9, 11) |
| 8/30 | (3, 5, 8, 11) |
| 9/30 | (3, 7, 11) |
| 10/30 | (7, 11) |
| 11/30 | (11). |

14. An encoding method comprising:
   (1) expurgating an input sequence by inserting predetermined values at selected bit positions of an input bit sequence and thereby providing an expurgated input bit sequence; and
   (2) performing a first convolutional encoding operation on the expurgated input bit sequence and thereby providing a systematic bit sequence and a first parity bit sequence, wherein inserting values at selected bit positions comprises choosing the selected bit positions according to an expurgation pattern associated with an output code rate, and wherein the output code rate and the associated expurgation pattern comprise one of:

| Code Rate | Expurgation Pattern |
|---|---|
| 6/30 | (0, 2, 4, 6, 8, 10) |
| 7/30 | (3, 5, 8, 9, 11) |
| 8/30 | (3, 5, 8, 11) |
| 9/30 | (3, 7, 11) |
| 10/30 | (7, 11) |
| 11/30 | (11). |

15. A convolutional encoder embodied in a tangible, non-transient medium, the convolutional encoder, comprising:
an expurgation unit configured to insert predetermined values at selected bit positions of an input bit sequence and thereby provide an expurgated input bit sequence;
a first component convolutional encoder section connected to receive the expurgated input bit sequence and configured to use the expurgated input bit sequence to perform a first convolutional encoding operation and thereby provide a systematic bit sequence and a first parity bit sequence; and
wherein the selected bit positions are selected in accordance with an expurgation pattern associated with an output code rate used by the convolutional encoder, wherein the output code rate and the associated expurgation pattern comprise one of:

| Code Rate | Expurgation Pattern |
|---|---|
| 6/30 | (1, 2, 5, 6, 9, 10) |
| 7/30 | (3, 5, 7, 9, 10) |
| 8/30 | (2, 5, 8, 11) |
| 9/30 | (2, 6, 10) |
| 10/30 | (6, 10) |
| 11/30 | (10). |

16. An encoding method comprising:
(1) expurgating an input sequence by inserting predetermined values at selected bit positions of an input bit sequence and thereby providing an expurgated input bit sequence; and
(2) performing a first convolutional encoding, operation on the expurgated input bit sequence and thereby providing a systematic bit sequence and a first parity bit sequence, wherein inserting values at selected bit positions comprises choosing the selected bit positions according to an expurgation pattern associated with an output code rate, and wherein the output code rate and the associated expurgation pattern comprise one of:

| Code Rate | Expurgation Pattern |
|---|---|
| 6/30 | (1, 2, 5, 6, 9, 10) |
| 7/30 | (3, 5, 7, 9, 10) |
| 8/30 | (2, 5, 8, 11) |
| 9/30 | (2, 6, 10) |
| 10/30 | (6, 10) |
| 11/30 | (10). |

* * * * *